United States Patent [19]
Gerdes et al.

[11] Patent Number: 4,989,219
[45] Date of Patent: Jan. 29, 1991

[54] MIDLEVEL CARRIER MODULATION AND DEMODULATION TECHNIQUES

[76] Inventors: Richard C. Gerdes, 4645 E. Quivira, Tucson, Ariz. 85718; Peter R. Vokac, 7835 N. Avenida Carlotta, Tucson, Ariz. 85704

[21] Appl. No.: 910,086

[22] Filed: Sep. 22, 1986

Related U.S. Application Data

[63] Continuation-in-part of Ser. No. 590,281, Mar. 16, 1984, Pat. No. 4,613,974.

[51] Int. Cl.$^5$ .................................. H04L 27/02
[52] U.S. Cl. ........................... 375/17; 375/52; 375/83; 375/95; 375/121; 332/115; 329/363
[58] Field of Search ............ 375/17, 37, 52, 53, 375/67, 80, 83, 86, 45; 329/104, 105, 110, 137, 145, 304, 347, 363; 332/9 R, 10, 16 R, 23 R, 29 R, 103, 115, 149, 167, 172, 174, 176, 185; 328/14, 18, 135, 114; 364/721; 324/77 E, 77 G; 455/42, 43, 110, 112, 205, 206, 214, 216; 370/12; 307/517; 360/29, 30, 39, 40, 43

[56] References Cited

U.S. PATENT DOCUMENTS

| | | | |
|---|---|---|---|
| 2,492,004 | 12/1949 | Potier | 332/15 |
| 3,037,190 | 5/1962 | Herbst | 375/52 |
| 3,456,194 | 7/1969 | Walker et al. | 370/12 |
| 3,495,158 | 2/1970 | Garnett et al. | 328/18 |
| 4,015,211 | 3/1977 | Sanchez | 329/106 |
| 4,121,295 | 10/1978 | Witt | 375/11 X |
| 4,252,995 | 2/1981 | Schmidt et al. | 375/52 |
| 4,272,845 | 6/1981 | Fiumani | 375/17 |
| 4,320,521 | 3/1982 | Balakrishnan et al. | 375/36 |
| 4,333,108 | 6/1982 | Quan et al. | 358/145 |
| 4,336,512 | 6/1982 | de Vries | 332/9 |
| 4,341,964 | 7/1982 | Chi et al. | 307/517 |
| 4,438,466 | 3/1984 | Fawkes et al. | 360/66 |

OTHER PUBLICATIONS

"Combination Leading and Trailing Edge Variable Slope Pulse Modulation", by O. E. Kruse, D. L. Lewis, & J. K. Jackson, Electronic Engineering, Mar. 1967, pp. 174-176.

Primary Examiner—Benedict V. Safourek
Attorney, Agent, or Firm—Cahill, Sutton & Thomas

[57] ABSTRACT

Several techniques are disclosed for producing modulation of a carrier signal wherein each transition of the modulated carrier signal includes a midrange level and/or two midrange characteristics, the level and/or ratio of the two midrange characteristics representing data carried by that transition. A simplified method over that disclosed in parent application Ser. No. 590,281, filed Mar. 16, 1984 now U.S. Pat. No. 4,613,974 is disclosed herein, and is referred to as a "flipped sine wave" method of producing the modulated carrier signal. Another technique, referred to as a "third harmonic modulation" technique uses the phase relationship between a fundamental and its third harmonic to produce the modulated carrier signal. A technique for storing the modulated carrier on magnetic media and correcting for offset resulting therefrom or from attenuation and advance of the third harmonic relative to the fundamental to permit accurate demodulation is disclosed.

41 Claims, 8 Drawing Sheets

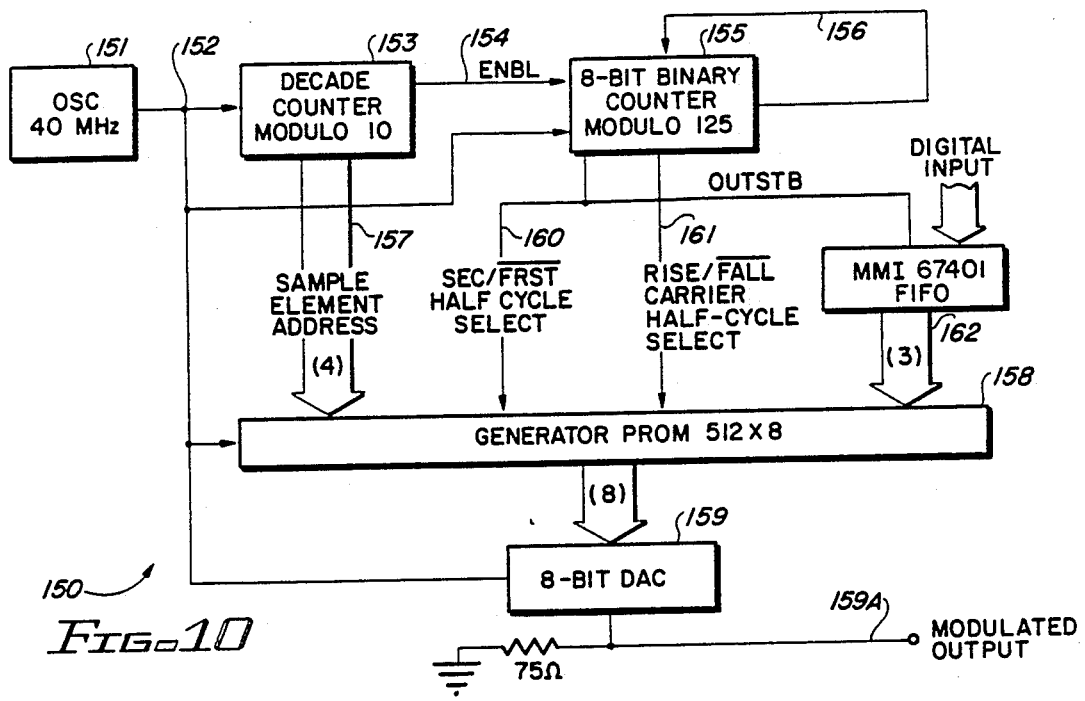
FIG-10
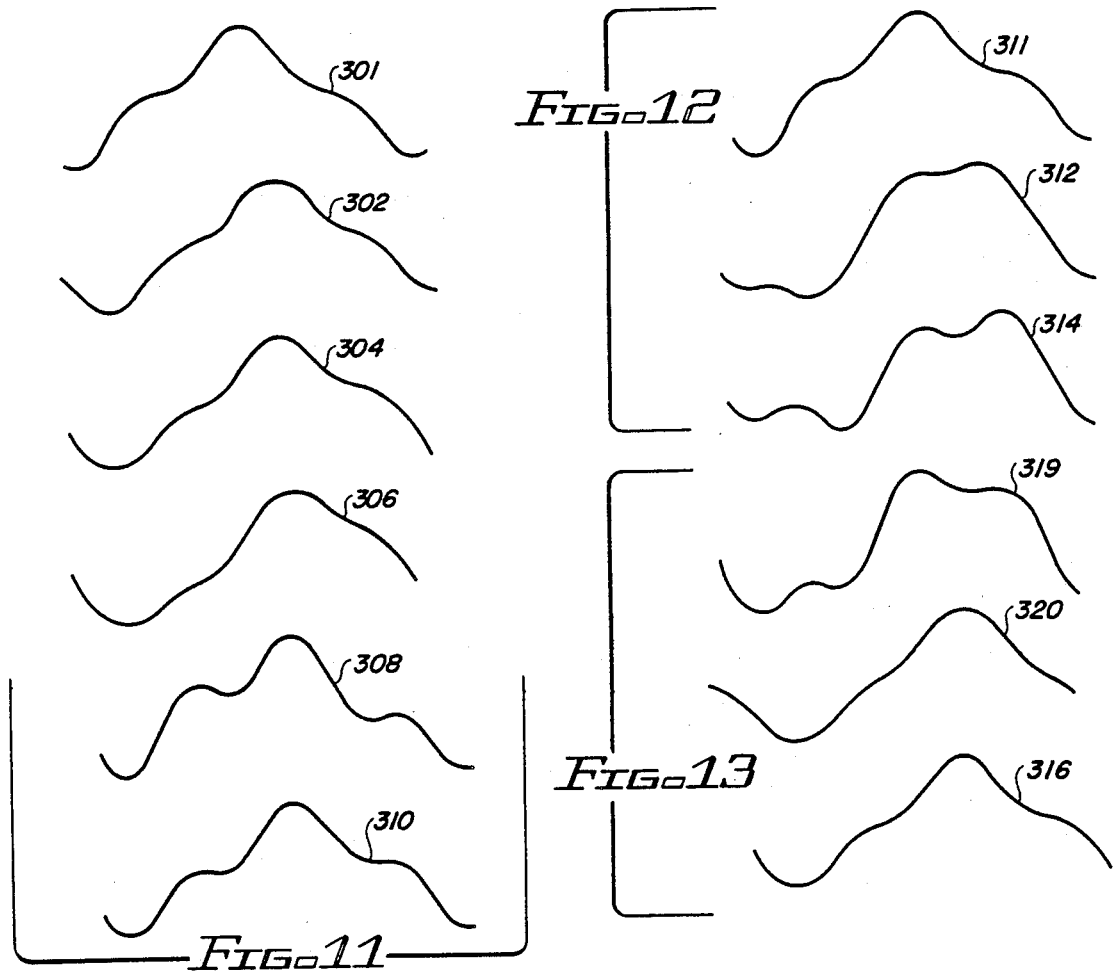
FIG-12
FIG-11
FIG-13

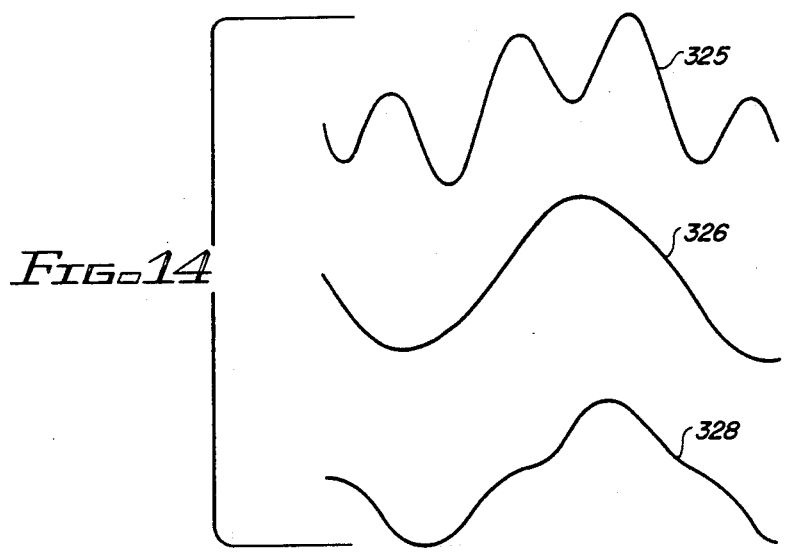
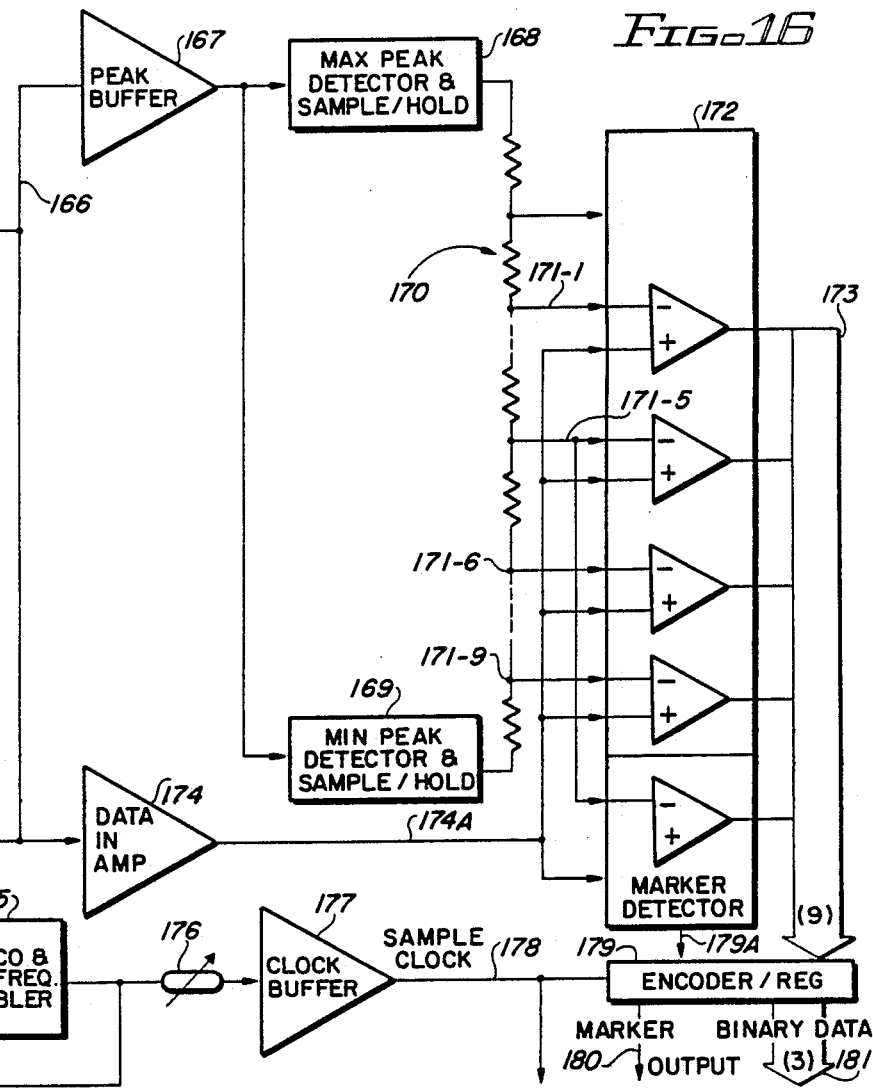

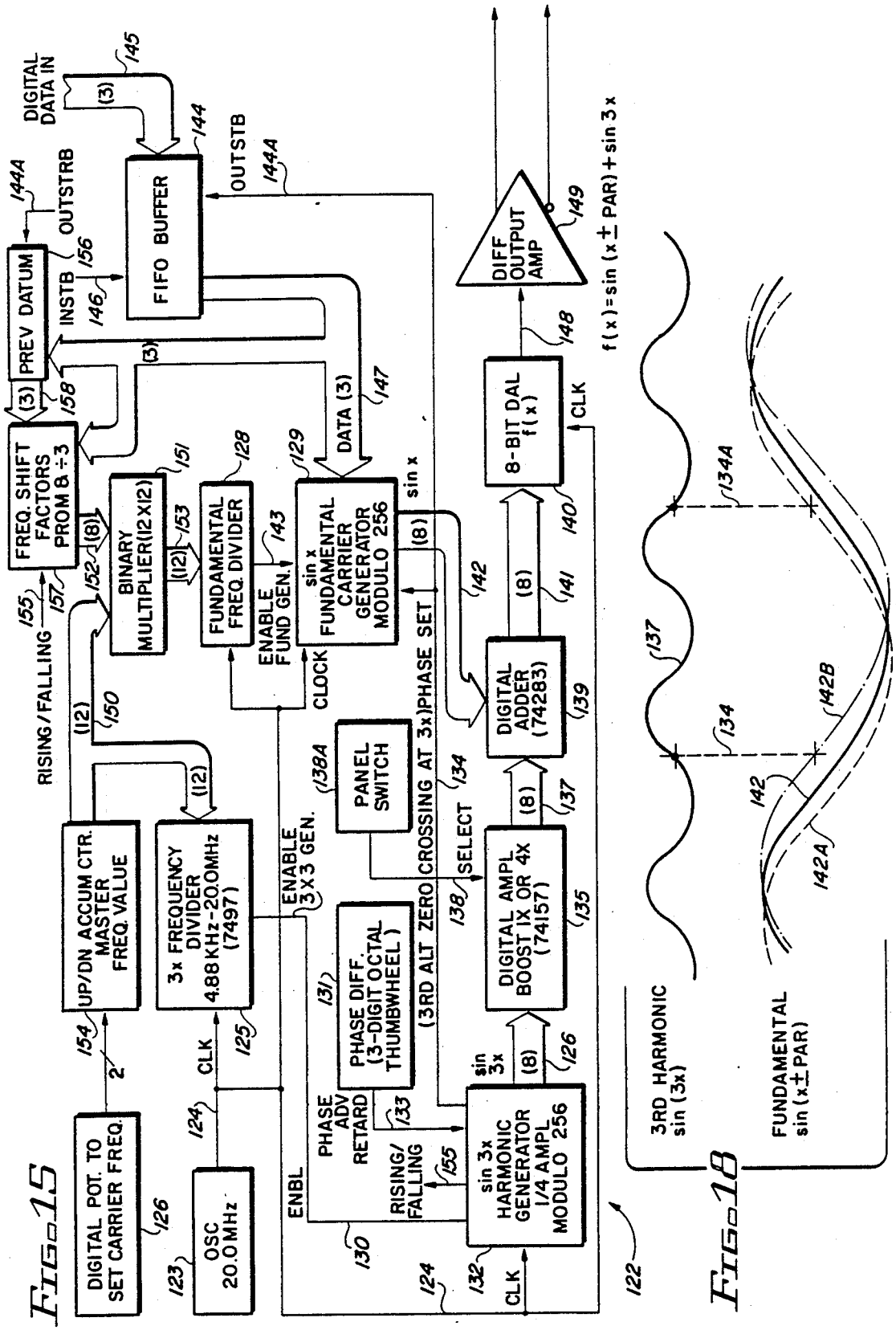

MIDLEVEL CARRIER MODULATION AND DEMODULATION TECHNIQUES

CROSS-REFERENCE TO RELATED APPLICATION

This application is a continuation-in-part of our copending application "METHOD AND SYSTEM FOR MODULATING A CARRIER SIGNAL", Ser. No. 590,281, now U.S. Pat. No. 4,613,974 filed Mar. 16, 1984, incorporated herein by reference.

BACKGROUND OF THE INVENTION

The invention relates to improved techniques for modulating carrier signals, and more particularly to techniques for modulating a carrier signal independently of the amplitude, frequency, and phase of the carrier signal to cause each half-cycle of the carrier signal to represent the logic states of a plurality of digital bits, and to techniques for demodulating such a carrier signal, and to techniques for generating frame markers therefore, generally in accordance with the teachings of above-described application Ser. No. 590,281.

A variety of modulation techniques are very well known, including amplitude modulation, frequency modulation, and phase modulation. Although it is possible to transmit digtal pulses directly along a communications medium, especially a wire or optical medium, it ususally is not practical to transmit large amounts of data directly in digital form via a wireles communication link. Consequently, digital data is "encoded" into high frequency modulation carrier signals using various pulse coded modulation (PCM) techniques, such as high frequency shift keying (FSK) techniques. All of these techniques require at least several cycles of the carrier signal for each digital bit transmitted.

Such digital data, encoded in analog form into modulated high frequency sinusoidal carrier signals by well-known modulation techniques, often is received by a receiver and stored (as received) on magnetic tape for archival purposes, and when it is necessary to be retrieved from the magnetic tape, the modulated signals are played back from the tape, fed into a demodulator, and then converted to digital form.

The state-of-the-art in transmission of digital data and modulation techniques is believed to be indicated by U.S. Pat. No. 3,993,862, Re-issue No. 30,182, U.S. Pat. Nos. 4,106,007, 4,227,250, 4,236,248, 4,339,823, 3,764,743, 3,821,481, and 3,755,739.

It would be desirable to have a technique for inexpensively modulating a carrier signal independently of its frequency, amplitude, and phase. It would also be desirable to have a technique for encoding or modulating a carrier signal to contain information which can be faithfully demodulated, despite considerable distortion imposed upon the modulated carrier signal by the communications channel. It would also be desirable to have a technique for encoding or modulating a carrier signal so that every half-cycle of the carrier signal contains information representative of the logic states of a plurality of digital bits. It would also be desirable to have a more economical, higher density storage of digital information than is presently available.

Although the techniques and circuits disclosed in above-identified parent application Ser. No. 590,281 appear to represent a breakthrough in the modulation/demodulation art, further research and experimentation has led to improved techniques for producing the modulated waveforms described therein and for effectuating storage of and retrieval of the modulated signals from magnetic media.

In copending application Ser. No. 590,281, the described invention provides a system and method for producing a signal having the form of a modulated carrier signal wherein in each data-carrying transition, a midrange level or a midrange ratio associated with two characteristics of that transition represents the data carried by that transition. The midrange ratio can be the ratio of the slope of one portion of the transition to the sum of two slopes of the transition, or it can be the ratio of the level of a midrange, relatively horizontal portion of the transition to the peak-to-peak level of the transition. The peaks of the modulated carrier signal can carry clocking information useful in demodulating the modulated carrier signal.

In one described embodiment of the invention described in copending application Ser. No. 590,281, the carrier signal initially is sinusoidal. The amplitude of the relatively horizontal modulation-produced level between successive positive and negative peaks is a predetermined proportion of the peak-to-peak amplitude of the carrier signal. The ratio of the slope of the leading portion of the transition to the sum of the slopes of the leading and trailing portions of the transitions also represents the same ratio. Demodulation is accomplished in one of two basic ways, either by measuring the slopes, or derivatives of the leading and trailing portions of each transition and obtaining the ratio of one of the two slopes to the sum of the two slopes, or by sampling the amplitude of the modulated signal at the beginning of the first transition, at the relatively level portion of the transition and at the end of the transition, and then taking the ratio of the intermediate level to the peak-to-peak amplitude to recover a quantity corresponding to the modulating data level (of the input signal). In a described embodiment of the parent application, a sinusoidal carrier signal is squared, and even numbered cycles of the squared carrier signal are gated by an analog switch to the input of a first analog multiplier. Odd numbered cycles of the squared carier signal are inverted and gated by an analog switch to an input of a second analog multiplier. The outputs of the two analog multipliers are resistively summed. The second input of each of the two analog multipliers is varied in accordance with the modulation data level of the input signal so that the total value of the signals applied to the second inputs of the two analog multipliers is equal to unity. The ouput signal produced by summing the outputs of the two analog multipliers is the modulated carrier signal, each transition thereof having an upper and lower portion separated by an intermediate, relatively level portion, the slopes and intermediate level representing the modulating data. In one described embodiment, the modulating data is produced by performing a digital-to-analog conversion of a plurality of N digital bits for each transition of the carrier signal to be modulated, in order to produce one of $2^N$ discrete levels as the value of the intermediate level of that transition.

Demodulation of the modulated carrier signal, or a replica therof arriving at the opposite end of a communication channel, is differentiated by a differentiating circuit that separates derivative pulses representing the slopes of negative-going transitions and positive-going transitions. Each transition produces two derivative pulses, the peak amplitudes of which are sampled by peak sense and hold circuits. The outputs of the peak sense and hold circuits are summed to produce a signal representative of the peak-to-peak amplitude of the modulated carrier signal at the time of the present transition. A signal representing the sum of the derivative peaks and a signal representing one of the derivative peaks are input to an analog divider which computes a signal that is representative of the ratio of one of the slopes of a particular transition to the sum of the slopes thereof and which therefore represents the present value of the modulating or input signal. This value is converted by means of an analog-to-digital converter circuit back to the level of the original N digital bits. Since the position of the peaks of the modulated carrier signal are detected with a peak sense and hold circuit, even if the peak is being frequency modulated or amplitude modulated, its occurrence is detected by the demodulator circuit and the data represented by the midrange ratios is recovered.

The presence of a transition without an intermediate level is interpreted as a frame marker. The encoding circuit produces various such frame markers causing direct full range transitions within a half-cycle of the carrier signal, holding the carrier signal at a maximum or minimum level for a full half-cycle of the carrier signal, and/or causing reverse transitions from a maximum or minimum level of the carrier signal to an intermediate level and back during a half-cycle of the carrier signal.

In a described embodiment in the parent application, the encoded analog signal can be stored on magnetic tape (and later played back and fed to the demodulator) to thereby produce an extremely high density of encoding analog or digital information on magnetic tape or other medium. The amount of information per cycle of the modulated carrier signal is many times that of conventional modulation techniques for analog information or for digitally encoded information in analog form.

In accordance with another embodiment described in copending application Ser. No. 590,281, a system and method are provided for producing a signal in the form of a carrier signal of a certain peak-to-peak amplitude and frequency that is comprised of alternating amplitude-modulated half-cycles of exactly twice the carrier frequency. Information is carried in pairs of these half-cycles which are joined internally by a 180 degree phase flip. The sum of the amplitudes of the half cyclces in each pair is constant and equal to the peak-to-peak amplitude of the carrier. Each pair is joined without a phase flip to adjacent pairs. The pairs are of two kinds, rising and falling. Each such transition carries a multilevel group of bits of information in the amplitude ratio between flip-to-peak and peak-to-peak levels. Peaks between pairs carry sample clock information.

An alternate embodiment described in application Ser. No. 590,281 involves the digital generation and recovery of nonsinusoidal digital AUDEL pairs. One simple digital modulation process produces a sequence of "square" levels alternating between high, midrange, low, midrange, high levels, etc., where the highs are equal to each other and greater than any midrange value, and the lows are equal to each other and less than any midrange value. Refinements of this digital process utilize more samples per carrier cycle and analog filter techniques to more closely approximate the desired sinusoidal modulation with fewer high frequency components. For both analog and digital implementations of the technique, a full range transition in a single step, either high-to-low or low-to-high, is interpreted as a frame marker; a transition from a positive or negative peak level to a midlevel and back to that peak level also is interpreted as a frame marker. Holding the carrier signal at either a positive or a negative peak level for an entire half-cycle of the carrier signal also is interpreted as a frame marker.

The signal at the decoder is first passed through a frequency spectrum restoration circuit to recreate the original form to each cycle. Then clock information (i.e., digital sample clock information) is recovered by phase locking a synchronous oscillator to the detected peaks of the modulated carrier signal. All registers in this circuit are updated on the leading edge of the sample clock. All data in this circuit is passed through ratio logic circuitry and threshold and partition logic circuitry during each sample clock cycle. Maxima and minima from the previous cycle are held in registers for presentation to the ratio logic circuitry. The analog peak detector circuitry determines whether the current sample is a high peak, a low peak, or a midrange datum, and generates appropriate control signals. A "previous value register" and a comparator performs a subtraction and magnitude comparison to determine if the current sample is a frame marker. New "data" is presented at an output port along with a flag signal. Any frame marker signal that occurs is produced at a separate digital output.

This mostly digital embodiment of the invention described in copending application Ser. No. 590,281 is less bandwidth-efficient and less noise resistant than other embodiments that fully utilize analog peak slope and phase transition detectors. However, this "digital" embodiment is both simpler and less expensive than the "analog" implementations of the invention, and is very amenable to digital large scale integration.

SUMMARY OF THE INVENTION

Accordingly, it is an object of the invention to provide improved circuitry and methods for producing modulation of the type described in above-referenced application Ser. No. 590,281.

It is another object of the invention to provide an improved technique for storing and recovering modulated carrier signals of the type described in application Ser. No. 590,281 onto and from magnetic media.

Briefly described, and in accordance with one embodiment thereof, the invention provides a system for producing a midlevel modulated carrier signal having a plurality of midrange levels in a plurality of respective rising and falling transitions thereof by producing a first signal having a first frequency and a second signal which has a predefined phase relationship to the first signal and which has a second frequency that is an integral multiple of the first frequency, producing a relative phase shift between the first and second signals in response to a modulation signal, and summing the first and second signals to generate the midlevel modulated carrier signal. In a described embodiment of the invention, the second signal is a third harmonic of the first signal. The summing results in the midlevel modulated carrier signal being produced with each transition thereof containing a midrange level in accordance with a corresponding level of the modulating signal. In one embodiment of the invention, a voltage controlled oscillator produces the second signal and a divide by-three counter is coupled between the output of the voltage controlled oscillator and input of a phase detector circuit receiving the first signal. The output is coupled to a voltage control input of the voltage controlled oscillator and summed with the error signal (produced when the phase detector is summed with the modulation signal) to vary the relative phase shift between the phases of the first and second signals. The first and second signals then are filtered before summing them to produce the midlevel modulated carrier signal.

In several embodiments of the invention, the midlevel modulated carrier signal is "precompensated" before transmitting it into a medium such as a transmission medium or a storage medium that distorts the phase and/or amplitude of the third harmonic component relative to the fundamental. The precompensation is achieved by producing a phase shift and/or a relative change in amplitude between the fundamental and third harmonic in inverse relationship to the respective media caused phase shift and/or attenuation, respectively, of the third harmonic relative to the fundamental.

Other embodiments of the invention include systems for demodulating midlevel modulated carrier signals having midrange levels in each rising and falling transition thereof representing modulation information. In one embodiment, the third harmonic component is filtered out of the midlevel modulated carrier signal, and a reference signal is generated that has a fixed relationship to a fundamental component of the midlevel modulated carrier signal. The reference signal has a frequency three times that of the fundamental. The phase difference between the filtered harmonic and the reference signal is detected by means of a phase detector to produce an output signal that represents the modulation information.

In one described embodiment of the invention, a phase locked loop circuit including a count-by-three circuit is used to divide the output of a voltage controlled oscillator by three before comparing the phase of the midlevel modulated carrier signal to the phase of the divided output signal. In another disclosed demodulating system, a midlevel modulated carrier signal having N permissable midrange levels in each of a plurality of respective rising and falling transitions includes circuitry for detecting and holding a maximum voltage of a high peak of the midlevel modulated signal and another circuit for detecting and holding a midlevel voltage of a low peak thereof. The difference between the maximum and minimum voltages is applied across a resistive divider network that produces N separate reference voltages that respectively represent the N different permissable midrange levels of each of the transitions. The instantaneous value of the midlevel modulated carrier signal then is compared to the N reference voltages at a time midway between the time of the maximum voltage and the time of the minimum voltage to determine the one of the N reference voltages to which the midrange level of the present transition is most nearly equal. That information is encoded to produce a base N number that represents the modulation information of the midrange level of the present transition.

In another similar embodiment of the invention, the durations of the present transition of the midlevel modulated signal which are close to each of the N reference voltages are measured, the longest such duration is determined, and that information is encoded to produce a base N number representative of the modulation information contained in the midrange level of the present transition of the midlevel modulated carrier signal.

A technique is disclosed for post-compensating the midlevel modulated carrier signal before demodulating thereof to produce a relative phase shift and/or amplitude change between the third harmonic component and the fundamental component of the midlevel modulated carrier in inverse relationship to the respective distortions thereof produced by a signal transmission medium or a signal storage medium.

BRIEF DESCRIPTION OF THE DRAWINGS

FIG. 10 is a block diagram of a video-rate digital midlevel modulation encoder of the present invention.

FIG. 11 is a diagram showing waveforms that are useful in describing the invention.

FIG. 12 is another diagram showing waveforms that are useful in describing the invention.

FIG. 13 is another diagram showing waveforms that are useful in describing the invention.

FIG. 14 is another diagram showing waveforms that are useful in describing the invention.

FIG. 15 is a block diagram of a midlevel modulation encoder and precompensation circuit.

FIG. 16 is a block diagram of a circuit for post-compensating and decoding midlevel modulation signals.

FIG. 18 includes waveforms that are useful in describing precompensation and post-compensation of midlevel modulated signals.

DETAILED DESCRIPTION OF THE INVENTION

Figure 1:
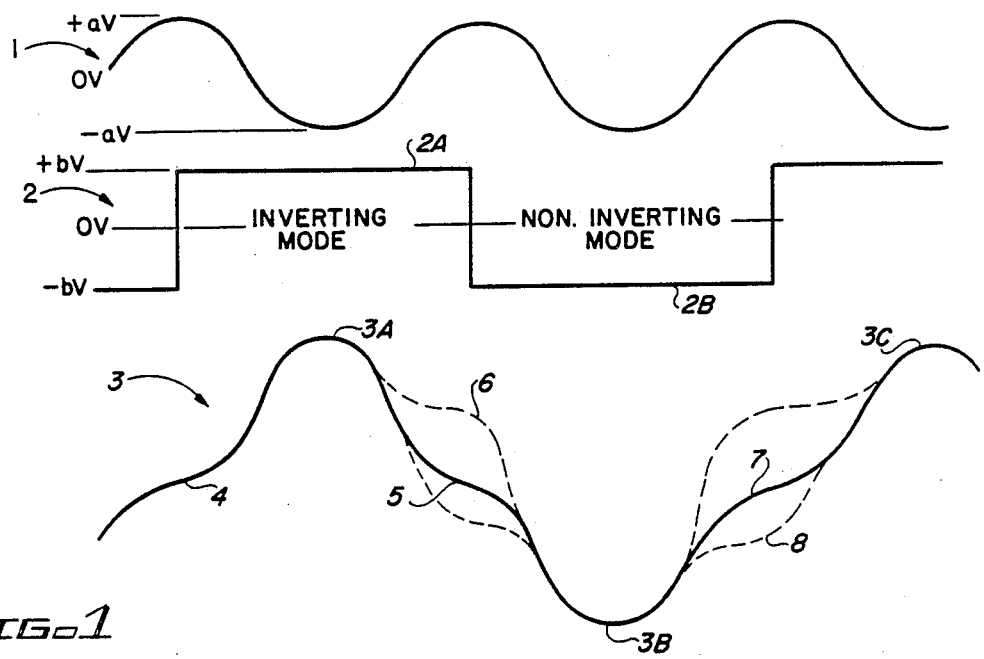
FIG. 1 shows three waveforms which are useful in describing the embodiment of the invention shown in FIG. 2.
Figure 2:
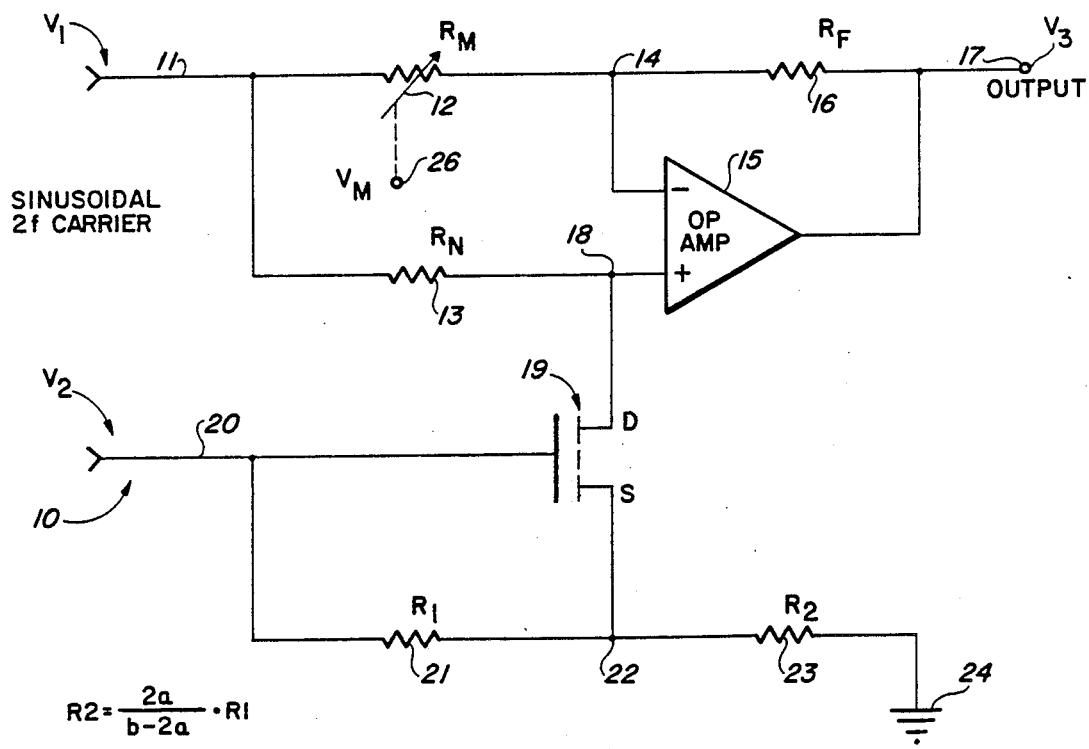
FIG. 2 is a schematic circuit diagram of a simplified "flipped sine wave" modulation encoder of the present invention.

Referring now to FIG. 1, sinusoidal waveform 1 is an unmodulated carrier signal. Its frequency is twice the frequency of a square wave input waveform 2, which, during high levels such as 2A, causes an "inverting mode" of the circuit 10 shown in FIG. 2, and during low levels such as 2B, causes a "noninverting mode"

operation of the circuit 10 of FIG. 2. The transitions of square waveform 2 occur at the positive peaks of unmodulated carrier waveform 1.

Waveform 3 in FIG. 1 represents the modulated carrier signal described in detail in copending application Ser. No. 590,281. Waveform 3 has a number of peaks such as 3A and 3C and a number of minimum levels such as 3B. Each positive-going transition and negative-going transition of modulated carrier waveform 3 has an intermediate level or "midrange level", such as levels 4, 5, 6, 7, and 8. The voltage at the intermediate level of each transition represents the information carried by that transition. In some cases, the actual voltage of the intermediate level is detected and decoded to produce the information carried by the half-cycle transition, while in other instances, the ratio of the slopes of the transition on either side of the intermediate level is decoded to obtain the information carried by the transition. When ratios of slopes are utilized to decode the information represented by a transition, the decoding is self-calibrating, making the information stored highly insensitive to amplitude distortion of the modulated carrier signal produced by transmission media. Depending upon the accuracy with which the intermediate levels or slope ratios can be detected, many bits of digital information can be represented by the intermediate levels per half-cycle of the modulated carrier signal.

Referring now to FIG. 2, this circuit shows an inexpensive, simple circuit that performs much the same modulating function as the more complex analog circuit shown in FIG. 1 of copending application Ser. No. 590,281. Circuit 10 has an input conductor 11 on which the sinusoidal unmodulated carrier waveform 1 of FIG. 1 is applied. A resistor 12 having a value $R_M$ is connected between conductors 11 and 14. The negative input of an operational amplifier 15 is connected to conductor 14. A feedback resistor 16 having a value of $R_F$ is connected between the output of operational amplifier 15 and conductor 14. The modulated carrier waveform 3 is produced on output conductor 17, which is connected to the output of operational amplifier 15. Operational amplifier 15 can be any of a variety of commercially available devices, such as a National Semiconductor LF411CN.

Resistor 13, having a resistance of $R_N$, is connected between conductor 11 and conductor 18, which is connected to the positive input of operational amplifier 15 and to the drain of an N channel MOSFET (metal oxide semiconductor field effect transistor) 19, which can be a Supertex VN0104.

The gate electrode of MOSFET 19 is connected to conductor 20, to which the square waveform 2 of FIG. 1 is applied. Resistor 21, having a value $R_1$, is connected between conductor 20 and conductor 22, which is connected to the source of MOSFET 19. Resistor 23, having a value $R_2$, is connected between ground conductor 24 and conductor 22.

The modulation level of circuit 10, i.e., the level of the midrange level such as 5, 6, 7, 8 of waveform 3 in FIG. 1, for the present half-cycle of modulated carrier waveform 3 depends, in essence, on the balance between the "inverting gain" and "noninverting gain" of circuit 10. Alternate cycles of the modulated carrier waveform 3 are produced when circuit 10 is caused to be in the inverting mode during positive pulses such as 2A of square wave input waveform 2 and noninverting operation during negative pulses such as 2B of waveform 2.

When square wave input 2 is positive, MOSFET 19 is turned on, thereby causing operational amplifier 15 to operate in an inverting mode by, in effect, connecting the positive input of operational amplifier 15 to an effective offset voltage. The offset voltage is the result of voltage division across R1 and R2 between the positive value of pulse 2A of waveform 2 and the voltage of ground conductor 24.

The reason that an offset voltage must be applied to the source of MOSFET 19 is to bias the output sine wave up by an amount equivalent to the peak-to-peak amplitude so that the negative portion of the output modulated carrier signal 3 has an amplitude equal to the positive peak thereof during the noninverting mode of operation. This offset voltage is necessary to bias the output signal properly so that the "50%" flip level is at zero volts. Thus, in the inverting mode of the circuit, the resistance divider of R1 and R2 must make node 22 equal to a voltage that biases the output sine wave so that the negative peaks are at zero voltage. In the noninverting mode, the voltage at node 22 biases the output sine wave so that the positive peaks are at zero volts. Thus, the transition occurs at the point where the circuit flips from inverting to noninverting operation.

To vary the intermediate levels 5, 6, etc., of the modulated output signal 3 produced by circuit 10, a modulation voltage $V_N$ is applied to conductor 26, which is the control input of variable resistor 12.

The intermediate level is given by the following equation:

$$l = \frac{\text{INVERTING MODE GAIN}}{\text{INVERTING MODE GAIN + NONINVERTING MODE GAIN}}$$

In the noninverting mode, the values of $R_M$, $R_F$, and $R_N$ are unimportant, and the noninverting voltage gain is always equal to 1.0. During the inverting mode, the gain of the circuit 10 is $R_F/R_M$. Thus, the above equation can be simplified to:

$$l = \frac{R_F/R_M}{(R_F/R_M) + 1} = \frac{R_F}{R_F + R_M}$$

Varying the modulation level by varying $V_M$, and hence $R_M$, in circuit 10 causes modulation in the amplitude of waveform C. This can be ignored in closed circuit system applications, such as a local area network, or in disk or tape storage systems, but cannot be ignored in other systems such as those in which midlevel modulation is superimposed over existing FM (frequency modulated) or AM (amplitude modulated) carriers, which can be performed in accordance with the invention.

The above-described circuit and method basically involves the process of "flipping" a sine wave having a frequency of 2f, modified with an offset voltage and a scale factor representing the modulation level. The mathematics involved in this process are set forth in the following equations.

The basic equation for the flipped sine wave is:

$$\begin{aligned} Va' = &(V1a + A1a \sin 2ft) \text{ for } -\pi/2 < 2ft < 3\pi/2 + \\ &(V2a + A2a \sin 2ft) \text{ for } 3\pi/2 < 2ft < 7\pi/2 + \\ &(V1b + A1b \sin 2ft) \text{ for } 7\pi/2 < 2ft < 11\pi/2 + \\ &(V2b + A2b \sin 2ft) \text{ for } 11\pi/2 < 2ft < 15\pi/2 + \end{aligned} \quad (1)$$

-continued $$\ldots + (V1n + A1n \sin 2ft) + (V2n + A2n \sin 2ft)$$

The quantities in the above equation are defined as follows:
- A is the amplitude of the sinusoidal term;
- V is the offset voltage of the sinusoidal term;
- 1 signifies the first term or first half of each modulated carrier cycle;
- 2 signifies the second term or second half of each modulated carrier cycle;
- a signifies the first full modulated carrier cycle;
- b signifies the second full modulated carrier cycle;
- n signifies the nth full modulated carrier cycle;
- t represents time.

From equation (3), three points are made about the flipped sine wave method of midlevel modulation. The first deals with the values of V.

$$V1n = V\text{peak} - A1n \ V\text{peak-to-peak}; \qquad (2)$$

$$V2n = V\text{peak} - A2n \ V\text{peak-to-peak}. \qquad (3)$$

The second point is that A is positive for 2 ft of $-\pi$ to $3\pi/2$, $7\pi/2$ to $11\pi/2$, etc. A is negative for 2 ft of $3\pi/2$ to $7\pi/2$, $11\pi/2$ to $15\pi/2$, etc. In other words, A1, A3, A5, etc. are positive.

The third point is the need for a clarification about first half and second half of the full modulated carrier cycle, and where the modulation actually exists.

Equation (1) is a statement describing the general format of the midlevel modulated carrier signal. In actual practice, the modulated data exists between 0 and $\pi$, $\pi$ and $2\pi$, ... and $(n)\pi$ and $(n+1)\pi$. In other words, the modulation level is different for each half-cycle of the modulated carrier cycle. Therefore, a new distinction of A must be made, as follows:

A11n is the amplitude of the sinusoidal term for $-\pi/2 < 2 \ \text{ft} < \pi/2$;

A12n is the amplitude of the sinusoidal term for $\pi/2 < 2 \ \text{ft} < 3\pi/2$;

A21n is the amplitude of the sinusoidal term for $3\pi/2 < 2 \ \text{ft} < 5\pi/2$; and A22n is the amplitud of the sinusoidal term for $5\pi/2 < 2 \ \text{ft} < 7\pi/2$.

The values of A12n and A21n must remain constant during the above range of 2 ft. Subsequently, the values of A22n and A11(n+1) must remain constant for 2 ft between $5\pi/2$ and $9\pi/2$, A12(n+1) and A21(n+1) constant for 2 ft between $9\pi/2$ and $13\pi/2$, etc.

$$2(A12n + A21n) \ V\text{peak-to-peak} = V\text{peak-to-peak} \qquad (4)$$

$$2(A12n + A21n) = 1 \qquad (5)$$

$$\begin{aligned} 2(-A22n + A11(n+1)) \\ V\text{peak-to-peak} = V\text{peak-to-peak} \end{aligned} \qquad (6)$$

$$2(-A22n + A11(n+1)) \ V_{peak\text{-}to\text{-}peak} = V_{peak\text{-}to\text{-}peak} \qquad (7)$$

From the example given by equation (1), the following relations are used to illustrate equations (4) and (5). For example, $$2(A12a - A21a) = 1 \qquad (7a)$$

$$2(-A22a + A11b) = 1, \text{ or} \qquad (7b)$$

$$A12a - A21a = -A22a + A11b \qquad (7c)$$

$$A21n = -(1 - 2A12n)/2 \qquad (8)$$

$$A11(n+1) = (1 + 2A22n)/2 \qquad (9)$$

The offset voltage is a function of the amplitude term, therefore, as the modulation level changes the value of A, it also changes the value of V. A bipolar signal with zero offset voltage is assumed in the following equations.

$$V12n = [V\text{peak}(1 - 2(A12n))]\text{volts} \qquad (10)$$

$$V21n = [V\text{peak}(1 - 4(A12n) + 2(A21n))]\text{volts} \qquad (11)$$

$$V21n = (-2A12n \ V\text{peak})\text{volts} \qquad (12)$$

$$V22n = [V\text{peak}(1 - 4(A11(n+1))) + 2(A22n)]\text{volts} \qquad (13)$$

$$V22n = [V\text{peak}(1 - 2A22n)]\text{volts} \qquad (14)$$

$$V11(n+1) = [V\text{peak}(1 - 2(A11(n+1)))]\text{volts} \qquad (15)$$

$$V11(n+1) = (-2A22n \ V\text{peak})\text{volts} \qquad (16)$$

The modulation level changes at $\pi$, $2\pi$, ..., $(n)^{90}$. This means that A12n and A22n are the parameters that are actually changed The other factors are all related to A12n and A22n.

The modulation exists in the changing of the values of A. The modulation level range has been identified as A12n or A22n = 0.1 minimum to A12n or A22n = 0.4 maximum. MLn is a three bit, eight level quantity.

$$ML1 = 7(A12n)/0.3 - 7/3 \qquad (17)$$

$$ML2 = 7(-A22n)/0.3 - 7/3 \qquad (18)$$

Where ML1 is the modulation level for the "first" modulation period or "first" half-cycle of the modulateed carrier, or, in other words, from 2 ft=0 to $\pi$. ML2 is the modulation level for the "second" modulation period or "second" half-cycle of the modulated carrier, i.e., for 2 ft=$\pi$ to $2\pi$. The following equations are valid for $0 \leq = ML \leq = 7$.

$$A12n = (0.3ML1 + 0.7)/7 \qquad (19)$$

$$A22n = -(0.3ML2 + 0.7)/7 \qquad (20)$$

$$A21n = (2((0.3ML1 + 0.7)/7) - 1)/2 \qquad (21)$$

$$A11(n+1) = (1 - 2((0.3ML2 + 0.7)/7))/2 \qquad (22)$$

In a practical midlevel modulator or encoder, V changes value, from V12n to V21n to V22n to V11(n+1) and back to V12(n+1) in a periodic fashion, with a period equal to 1/f, where f is the frequency of the Audel modulation carrier signal. The V values, in terms of ML values, are as follows, again with the condition: $0 \leq = ML \leq = 7$.

$$V12n = [V\text{peak}(1 - 2((0.3ML1 + 0.7)/7))]\text{volts} \qquad (23)$$

$$V21n = [-2((0.3ML1 + 0.7)/7)V\text{peak}]\text{volts} \qquad (24)$$

$$V22n = [V\text{peak}(2((0.3ML2 + 0.7)/7) - 1)]\text{volts} \qquad (25)$$

$$V11(n+1) = [2((0.3ML2 + 0.7)/7)V\text{peak}]\text{volts} \qquad (26)$$

With the derivation of equations (1) and (19) through (26), the flipped sine wave method of generating midlevel modulation can be implemented. (Note that there is readily available software that utilizes these equations for circuit analysis, transmission media analysis, graphic illustration and Fourier analysis of harmonic spectrum. For example, the program "SPP", by BV Engineering or the program "P-SPICE" by Micro-Sim can be used.)

Electronic circuits, utilizing these equations, have been designed and constructed. Analog, digital and hybrid technologies have been used successfully to demonstrate the technology.

Figure 3:
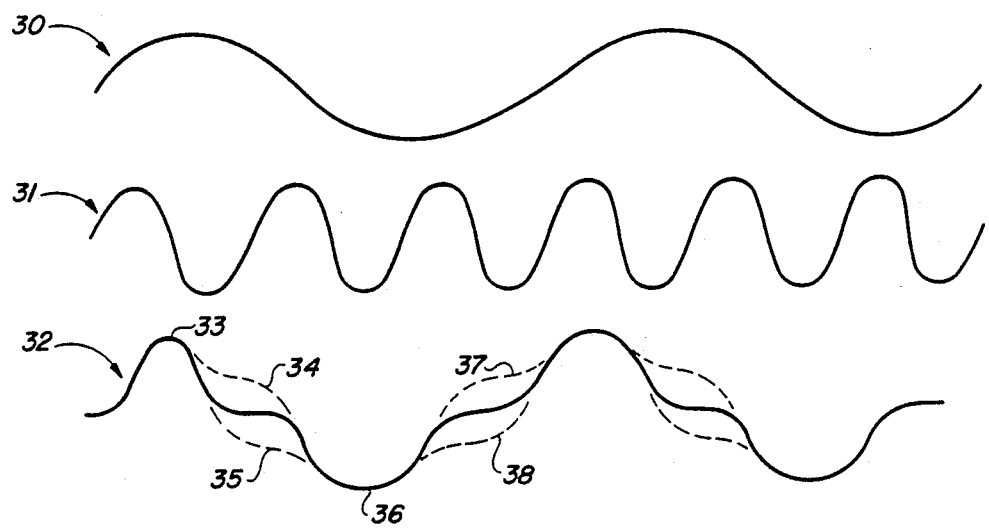
FIG. 3 is a diagram showing the waveforms of an unmodulated carrier input, the third harmonic of the unmodulated carrier input, and a midlevel modulated carrier output produced by the circuit of FIG. 4.

Next, another approach to producing midlevel modulation on an unmodulated carrier, using a technique referred to herein as "third harmonic modulation" is described. First, in FIG. 3, waveforms 30 and 31 are applied to input conductors 41 and 47 of the third harmonic midlevel modulator circuit 40 of FIG. 4. (Alternately, waveform 30 can be applied to conductor 47 and waveform 31 can be applied to conductor 41.) Waveform 30 is an unmodulated sinusoidal signal having a frequency of f. Waveform 31 has a frequency equal to 3f, and can be the third harmonic of waveform 30. The phase of waveform 31 must be precisely related to the phase of waveform 30.

Waveform 32 can be the same as the midlevel modulated carrier signal produced on conductor 46 of the modulator circuit 40 carrying separate information on midrange levels of each positive-going transition and each negative-going transition.

Figure 4:
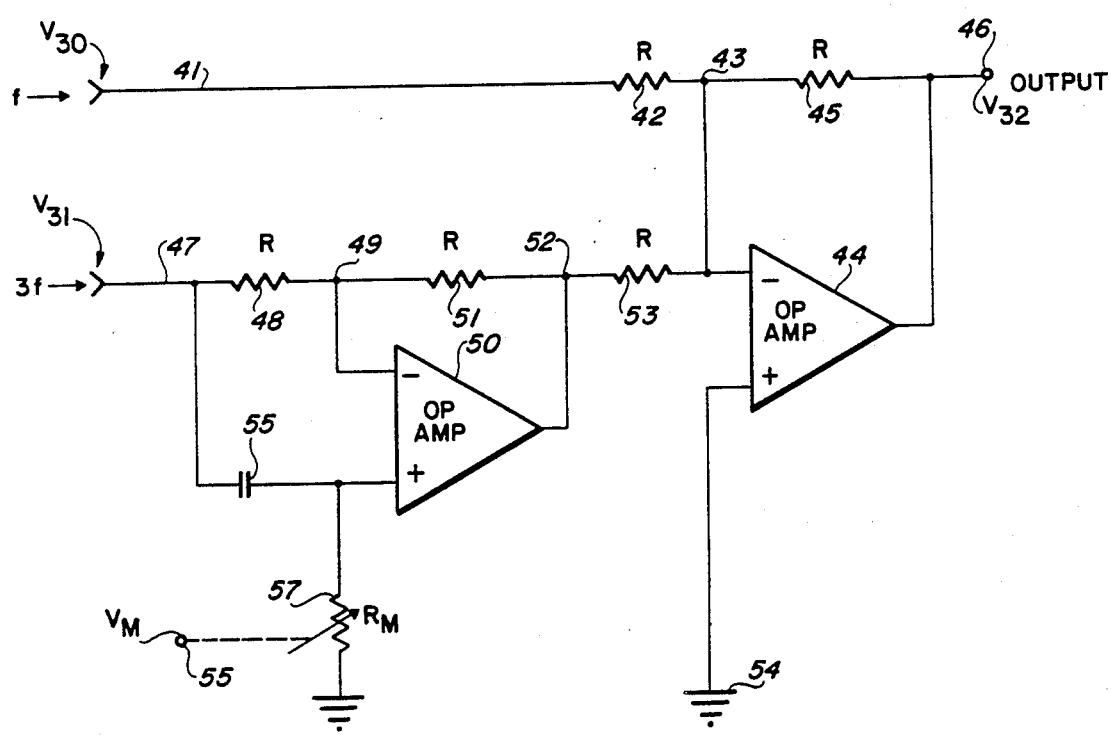
FIG. 4 is a schematic circuit diagram of a "third harmonic modulation" encoder of the present invention.

The value of $R_M$, which is the value of variable resistor 57 in FIG. 4, is varied in response to $V_M$ to determine the value of the midrange level of each transition of waveform 32. A practical component to use for $R_M$ is a FET. There are commercially available junction FETs designed as variable resistors. The voltage, Vm, is a function of the characteristics of the FET. A commercial example of such a device is a Siliconix type VCR7N, although about any junction FET or MOSFET device could be used.

Referring now to FIG. 4, third harmonic midrange modulator circuit 40 includes resistor 42, which has a resistance R, connected between conductor 41 and conductor 43, which is connected to the negative input of operational amplifier 44 and one terminal of resistor 45, which also has a resistance R. The other terminal of resistor 45 is connected by conductor 46 to the output on which waveform 32 is produced and to the output of operational amplifier 44. The positive input of operational amplifier 44 is connected to ground conductor 54.

Resistor 48, which has a resistance R, is connected between input conductor 47 and conductor 49, which is connected to the negative input of operational amplifier 50 and to one terminal of resistor 51, which has a resistance R. The other terminal of resistor 51 is connected by conductor 52 to the output of operational amplifier 50 and to one conductor of resistor 53, the other terminal of which is connected to conductor 43.

A capacitor 55 having a capacitance C is connected between conductor 47 and conductor 56. Conductor 56 is connected to the positive input of operational amplifier 50 and to one terminal of variable resistor 51, which has a resistance $R_M$, and is controlled by a voltage $V_M$ applied to conductor 55. The other terminal of variable resistor 57 is connected to ground conductor 54.

Resistors 42, 45, 48, 51, and 53 all can have the same resistance. R, but this is not critical. The more critical component values in circuit 40 are the values of C and $R_M$. The circuit operates by changing the phase of waveform 31 relative to the phase of waveform 30 in responses to changes in the value of $R_M$. The equation for the voltage appearing on conductor 52 is as follows:

$$\phi = -180° - 2\tan^{-1}(2fR_mC) \tag{27}$$

The derivation for above equation (27) can be found in the text by Burr-Brown Corporation, entitled "Applications of Operational Amplifiers, Third Generation Techniques", by Jerald G. Graeme, McGraw-Hill, 1973, dealing with active filters of the "all pass" type used for phase shifting.

In operation, operational amplifier 50 of the circuit of FIG. 4 produces the phase shift of the signal applied to conductor 47, determined by the time constant $R_M C$. The output of operational amplifier 50 is summed with the signal applied to conductor 41. The summing of the resulting input signals having the frequency f and 3f, with the phase relationship being adjusted by varying $R_M$ and summing them at conductor 43, produces the waveform 32 on conductor 46.

It should be noted that the third harmonic midlevel modulator circuit 40 produces amplitude variation in waveform 32 and a variation in the phase of the output waveform 32 relative to the unmodulated carrier input waveform 30 as a result of the summing of the f and 3f frequency signals 30 and 31. As previously mentioned, this is not desirable for open loop communication systems, but is satisfactory in closed loop communication systems and for data storage on magnetic media.

Operational amplifiers 44 and 50 can be easily implemented by various suitable commercially available integrated circuit operational amplifiers.

The basic equation for the third harmonic midlevel modulation generation technique described above with reference to FIGS. 3 and 4 is:

$$Va'' = V1 \sin(ft) + V3 \sin 3(ft+M) \text{ for all ft values.} \tag{28}$$

The parameters and variables of the above equation are defined as follows:

V1 is the amplitude of the fundamental sinusoidal term;

V3 is the amplitude of the third harmonic sinusoidal term;

VM is the phase angle representing modulation.

The midlevel modulation takes place through slope cancellation. The cancellation is caused by the slope of the third harmonic term having an equal and opposite quantity to the fundamental slope. Since the derivative of the third harmonic term is exactly three times greater than the fundamental derivative, the following relationship exists:

$$V3 = V1/3 \tag{29}$$

For a slope cancellation to occur at exactly the midpoint in amplitude and time, ML=3.5, the fundamental term must be at a value for ft=0 radians or zero degrees, and the third harmonic term must be at 180 degrees or ft=1.047 radians. This places a value on M of:

$$M = 180/3 = 60 \text{ degrees, or } M = 2\pi(60/360) = 0.3491 \text{ radians.} \tag{30}$$

Rewriting equation (28):

$$Va'' = V1 \sin(ft) + (V1/3) \sin 3(ft+60) \text{ in degrees.} \tag{31}$$

$$Va'' = V1 \sin(ft) + (V1/3) \sin 3(ft + 0.3491 \text{ in radians}. \tag{32}$$

This equation is written for ML=3.5. The relation of M and ML, to express VA″ in terms of ML, is:

$$M = (40ML/7 - 20) \text{ degrees} \tag{33}$$

$$M = (0.03325714ML - 0.1164) \text{ radians}. \tag{34}$$

If Va″ is plotted over several cycles, it will closely resemble the "flipped" sine wave for ML=3.5. For other values of ML, the flat region is no longer flat, due to the slope of the fundamental being less than it is at ft=0. This suggests that the amplitude term of the third harmonic is not a constant but needs to be a function of the fundamental term value. This can be expressed as a cosine function of the angle value of the fundamental:

$$V3' = (V1/3) \cos(ft) \tag{35}$$

Rewriting equations (31) and (32), in terms of ML and V3′:

$$Va'' = V1 \sin(ft) + ((V1/3) \cos ft) \sin 3(ft + 40ML/7 - 20 + 60) \text{ in degrees} \tag{36}$$

$$Va'' = V1 \sin(ft) + ((V1/3\cos ft) \sin 3(ft + 0.03325714ML - 0.1164 + 0.3491) \text{ in radians} \tag{37}$$

Equations (36) and (37) yield a close correction to the flatness of the midlevel modulation over all values of ML, i.e., $0 \leq =ML \leq =7$.

The errors that still exist are located at the peak amplitude of Va″ and at the phase of the peaks. The "flipped" sine wave method of generation does not have these errors The errors result from the vector addition of the two sinusoids under differing phase angle relationships.

Correction of the peak amplitude and phase errors yields an equation as follows;
For degrees:

$$Va'' = (V1/(\cos(1.6263(40 \text{ ML}/7 - 20))))\sin(ft - 1.39(40 \text{ ML}/7 - 20)) + (((V1/3)/(\cos(1.39(40 \text{ ML}/7 - 20))))\cos(1.39(40 \text{ ML}/7 - 20)))*\sin(3(ft + 60 + (40 \text{ ML}/7 - 20)) - 1.39(40 \text{ ML}/7 - 20)) \tag{38}$$

For radians:

$$Va'' = (V1/(\cos(.05408609 \text{ ML} - .1893)))\sin(ft - .04622742 \text{ ML} - .1618) + (((V1/3)/(\cos(.04622742 \text{ ML} - .1618)))\cos(.04622742 \text{ ML} - .1618))*\sin(3(ft + .3491 + (.03325714 \text{ ML} - .1164)) - .0462742 \text{ ML} - .1618) \tag{39}$$

where * implies multiplication.

The equations (38) and (39) have been used in software for simulations and harmonic analysis and in hardware for midlevel modulation generation. Both methods outlined in this paper are compatible with the various decoding methods that are described herein and in copending application Ser. No. 590,281.

The third harmonic midlevel modulation technique is mathematically simpler than the earlier described flipped sine wave midlevel modulation technique, but requires greater complexity of circuitry.

At a "50 percent" or ML=3.5 modulation level, the resultant waveform generated by the third harmonic midlevel modulation technique is similar to the waveform generated by the flipped sine wave midlevel modulation technique. At levels other than 50 percent or ML=3.5, the flipped sine wave technique maintains the midlevel modulation level at $-\pi/2$, $3\pi/2$, $7\pi/2$, etc. The third harmonic midlevel modulation method does not maintain this timing. During transmission and recording processes, this timing is usually altered. Both the flipped sine wave and third harmonic midlevel modulation techniques are therefore useful in transmission and recording processes.

Figure 5:
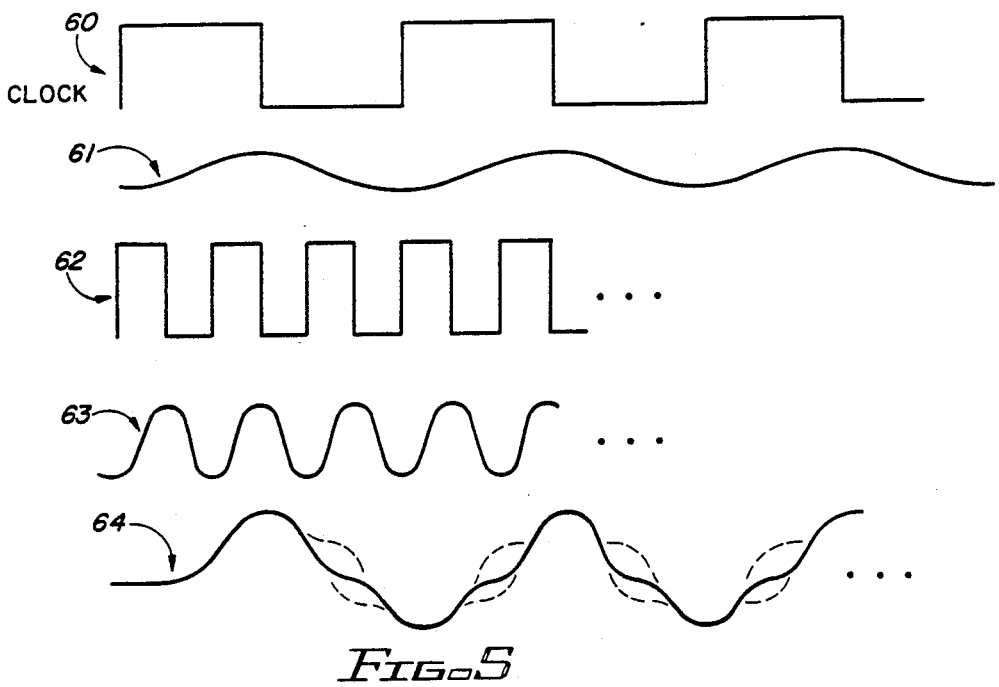
FIG. 5 is a diagram showing waveforms useful in explaining the operation of the circuit of FIG. 6.
Figure 6:
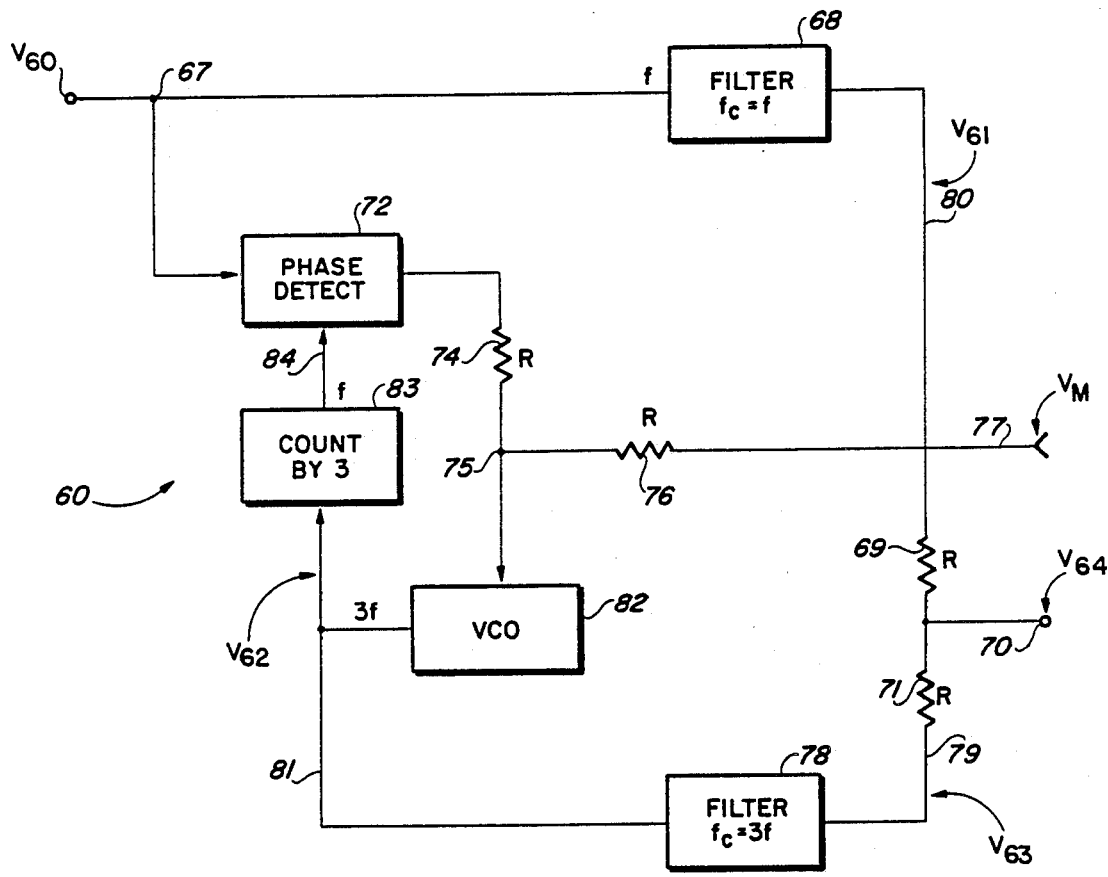
FIG. 6 is a block diagram of a third harmonic midlevel modulator circuit that operates from a single clock input and a modulation input.

FIG. 6 shows a circuit that generates both a fundamental sinusoidal signal waveform 61 in FIG. 5, and also generates a third harmonic sinusoidal waveform 63 in FIG. 5, using a phase locked loop circuit, and sums the fundamental and third harmonic sinusoidal waveforms to produces a midlevel modulated carrier signal shown by waveform 64 in FIG. 5.

The square wave input signal $V_{60}$ shown by waveform 60, having a frequency f is applied to conductor 67. Conductor 67 is connected to the input of a suitable filter circuit having a center frequency $f_c$ equal to f and produces a nearly sinusoidal waveform $V_{61}$ on conductor 80. Conductor 80 is connected to one terminal of a summing resistor 69, which may have a resistance R, the other terminal of which is connected to conductor 70, on which voltage $V_{64}$, corresponding to waveform 64 in FIG. 5, is produced.

The clock signal $V_{60}$ is applied to one input of a phase detector circuit 72. The error output of phase detector 72 produces a DC error voltage on conductor 73, which is connected to one terminal of a summing resistor 74, which may have a resistance R. The other terminal of resistor 74 is connected by conductor 75 to the voltage control input of a voltage controlled oscillator 82, the output of which is connected to conductor 81. Conductor 75 is also connected to a summing resistor 76, which may have a resistance R. The other terminal of resistor 76 is connected by conductor 77 to a modulation input voltage $V_M$, so that the DC error voltage produced by phase detector 72 on conductor 73 is summed with the modulation voltage $V_M$.

Conductor 81 is connected to a count-by-three circuit 83, the output of which is connected to another input of phase detector circuit 72. Conductor 81 also is connected to an input of a filter 78 having a center frequency $f_c$ equal to 3f. The output of filter 38 produces a signal $V_{63}$ having waveform 63 of FIG. 1 on conductor 79, which is connected to one terminal of summing resistor 71, which may have a resistance R. The other terminal of summing resistor 71 is connected to output conductor 70.

Phase detector 72, voltage controlled oscillator 82, and count-by-three circuit 83 constitute a phase locked loop circuit, the operation of which is well-known to those skilled in the art. In this case, count-by-three circuit 83 causes the frequency of $V_{62}$ to be three times the frequency of $V_{60}$. I.e., $V_{62}$ has a frequency 3f. This is because phase detector 72 produces a sufficiently large DC error voltage on conductor 73 to cause voltage controlled oscillator 82 to oscillate at a high enough frequency to make the signal on conductor 84 have the same frequency and phase as $V_{60}$, causing $V_{62}$ to have a frequency of 3f. Filter circuit 78 converts the 3f frequency square wave of waveform 62 to a nearly sinusoidal waveform 63, which then is summed with $V_{61}$ to produce the midlevel modulated carrier waveform 64 of FIG. 5.

Filters 68 and 78 and phase detector 72 and voltage controlled oscillator 82 can all be very easily implemented by those skilled in the art. Count by three circuit 83 also can easily be implemented by operating the VCO at 6f and using a toggle flip-flop to achieve a 3f output at 50% duty cycle plus a count-by-three (using a CD4017 counter truncated to a three count) followed by a toggle flip-flop for an f-frequency output with 50% duty cycle.

The 74-160 series of counter/dividers also can produce the count-by-three function.

Ordinarily, the modulation input voltage $V_M$ would be fairly small compared to the DC error voltage on conductor 73, so that rapid changes in $V_M$ can be quickly responded to by the voltage controlled oscillator circuit 82 to produce shifts in the 3f third harmonic signal $V_{62}$ during each half-cycle of the midlevel modulated carrier signal 64, so that the midlevel voltage for each positive-to-negative or negative-to-positive transition can occur It is necessary that the modulation voltage $V_M$ be constant during the occurrence of the resulting midlevel voltages in waveform 64. The phase detector and voltage controlled oscillator are readily available on asingle integrated chip in the form of a commercially available phase locked loop integrated circuit, such as a Signetics NE-565-N.

It may be desirable to insert a sample and hold circuit between conductor 77 and the right-hand terminal of summing resistor 76 and utilize the input clock frequency signal $V_{60}$ to latch $V_M$ into the sample and hold circuit to ensure accurate inputting of $V_M$ into voltage controlled oscillator 82. Each transition of clock input signal $V_{60}$ would then update the newest value of $V_M$ into the circuit 60.

Of course, it is necessary to ensure that clock signal $V_{60}$ is a precise square wave. If it is not, a toggle flip-flop should be utilized to convert it to a precise square wave, because otherwise $V_{61}$ will not be a precise sinusoidal waveform.

Figure 7:
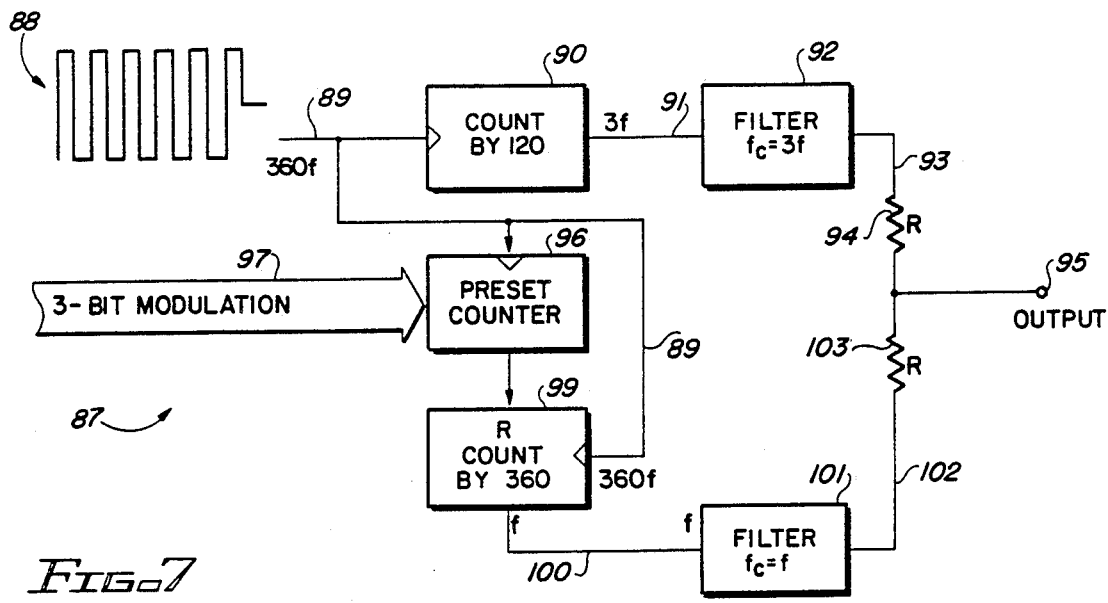
FIG. 7 shows a block diagram of a third harmonic midlevel modulator circuit that receives a digital, rather than analog modulation input.

Referring now to FIG. 7, a midlevel modulator 87 based on the above-described third harmonic midlevel modulation technique operates in response to a single square wave clock signal 88 having a frequency of 360f applied to clock input conductors 89. A digital three bit modulation input signal is applied to seven input conductors 97 of a preset counter 96.

Conductor 89 is connected to the toggle input of a count-by-120 circuit 90, which can be easily implemented by those skilled in the art, using a square wave output is needed to drive the filters. A count-by-60 function (i.e., from a Texas Instruments 74AS867) followed by a toggle flip-flop provides the count of 120. Modulo 120 counter 90 produces a square wave signal on conuctor 91 having a frequency of 3f, which is applied to the input of a filter circuit 92, having a center frequency $f_c$ equal to 3f. A nearly sinusoidal "third harmonic" signal is produced by filter 92 on conductor 93 and applied to one terminal of a summing resistor 94, which can have a resistance R. The other terminal of resistor 94 is connected to output conductor 95, which produces a midlevel modulated signal such as waveform 32 of FIG. 3 and waveform 64 of FIG. 5.

Clock signal 88 also is applied by conductor 89 to a toggle input of preset counter 96 and to a toggle input of a count-by-360 counter 99. The output of preset counter 96 is connected to a reset (R) input of modulo 360 counter 99 (which can be a Texas Instruments 74AS867), the output of which produces a square wave signal having a frequency f on conductor 100, which also is connected to the input of a filter cirucit 101 having a center frequency of f. The modulo 360 counter can be a Texas Instruments 74AS867 as a "count-by-180 circuit" followed by a toggle flip-flop to provide a total count of 360 and a perfect square wave output. Filter 101 produces a nearly sinusoidal "fundamental" signal on conductor 102, which is summed by summing resistor 103 having resistance R with the "third harmonic" signal on conductor 93 to produce the midrange modulated output signal referred to above.

Preset counter 96 (which can be a Texas Instruments 74AS867) produces a reset signal on conductor 98 that is controlled by the seven bit modulation signal 97. The seven bit modulator signal causes preset counter 96 to count a number of clock signals determined by the seven bit modulation signal before producing the reset signal on conductor 98, and resets modulo 360 counter 99 after a phase angle delay corresponding to the digital value of the seven bit modulation input signal 97. This phase angle introduced between the "fundamental" sinusoidal signal produced on conductors 100 and 102 and the "third harmonic" signal produced on conductors 91 and 93 thereby controls the midlevel of the present positive-to-negative or negative-to-positive transition of the midlevel modulated carrier signal produced on conductor 95.

The flipped sine wave midlevel modulation circuit of FIG. 2 has the advantages of being very simple in structure, and could be easily implemented on a single monolithic integrated circuit chip for use in applications such as disk drives and closed circuit communication systems.

The third harmonic midlevel modulation circuit of FIG. 4 is a purely analog implementation which will be easily implementable on a single monolithic integrated circuit. Like the circuit of FIG. 2, the circuit of FIG. 4 requires two signal inputs. The circuit shown in FIG. 6 requires only a single square wave clock input and an analog modulation input, which makes it useful for either analog or digital applications.

The circuit of FIG. 7 has the advantages of using a single digital clock input, and has the advantage of using a digital rather than an analog input.

In the above circuits, the filters can be implemented by conventional RC networks or analog filters employing operational amplifiers, or can be switched capacitor filters, all of which are readily available and easily implemented and used by those skilled in the art. If switch capacitor filters are used in a bandpass mode of operation, the clock signal can be utilized to produce a fairly high Q bandpass function and thereby ensuring nearly perfect sinusoidal outputs, avoiding the need for the clock signals to have an exactly 50 percent duty cycle. There are several manufacturers of switched capacitor filters. Specifically, the National Semiconductor MF-10-CN is such a part. Although it is desirable to have a 50% duty cycle clock, it is not necessary, since the consideration in the MF-10 internal circuits has to do with settling time of the internal operational amplifiers instead of the filter function.

Figure 8:
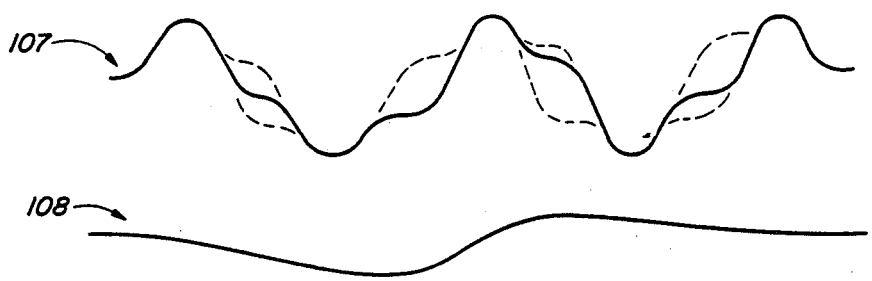
FIG. 8 shows waveforms that are useful in describing the demodulator circuit of FIG. 9.
Figure 9:
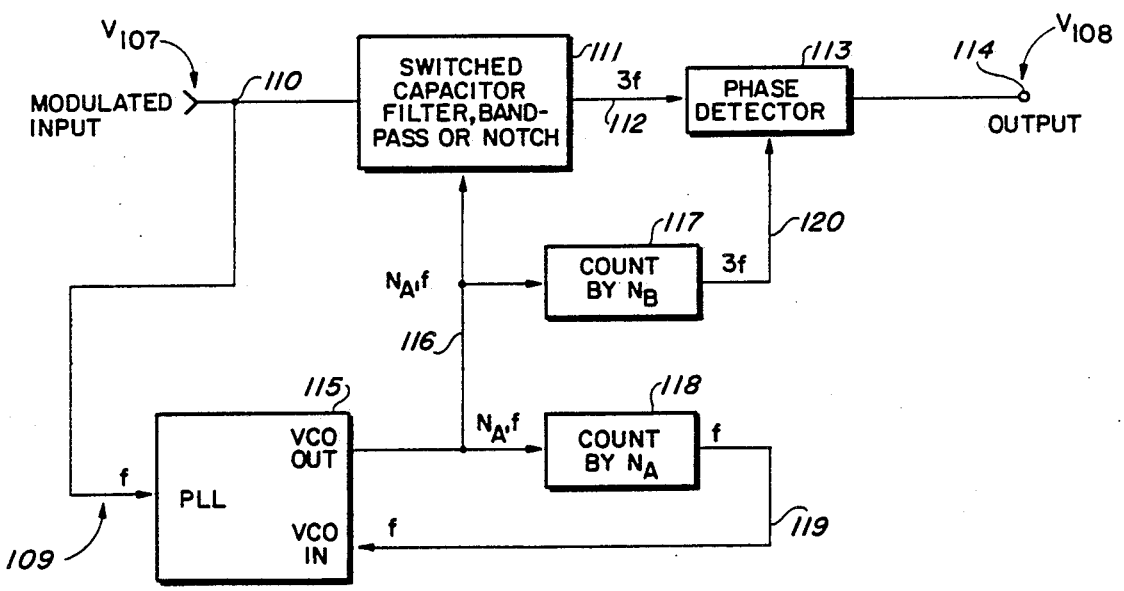
FIG. 9 is a block diagram of a midlevel demodulator circuit that can be utilized to demodulate midlevel modulated waveforms such as waveforms 3, 32, and 64 in FIGS. 1, 3, and 5, respectively.

FIG. 9 shows a midlevel demodulator circuit 109 that receives a midlevel modulated signal $V_{107}$ corresponding to waveform 107 in FIG. 8 on conductor 110 and produces an output signal $V_{108}$ having the waveform 108 in FIG. 8 on output conductor 114, which is an analog output signal representing the midlevel values of the various positive and negative-going transitions of the modulated input signal $V_{107}$. Demodulator circuit 109 includes a switched capacitor, bandpass, or notch filter 111 having an input connected to conductor 110 and an output 112 connected to one input of a phase detector circuit 113.

Input conductor 110 also applies modulated input signal $V_{107}$, which has a frequency f, to the input of a phase locked loop circuit 115. Phase locked loop circuit 115 includes a voltage controlled oscillator output conductor 116 which is connected to an input of filter circuit 111 and to an input of count-by-$N_B$ circuit 117. The signal on conductor 116 has a frequency of $fN_A$. $N_B$ is equal to $N_A$ divided by 3, so counter circuit 117 produces a signal on conductor 120 having a frequency of 3f, which is applied to the other input of phase detector 113. The filtered signal on conductor 112 applied to the first input of phase detector 113 has a frequency f.

Conductor 116 also is connected to an input of a count-by-$N_A$ circuit 118, which produces a signal having a frequency f on conductor 119. Conductor 119 is applied to the input of the voltage controlled oscillator of phase locked loop circuit 115.

As previously explained, modulated signals such as 107 inherently have a large third harmonic component. For each half-cycle, the phase of the concurrent third harmonic component varies in accordance with the potential of the midrange level.

In the demodulator of FIG. 9, phase locked loop 115, in combination with count by-$N_B$ counter 117 generates a "reference" third harmonic signal on conductor 120, having a constant frequency 3f, where f is the frequency of the modulated carrier signal 107.

The switched capacitor filter 111, which can be either a notch filter or a bandpass filter, such as a MF-10-CN from Harris Semiconductor and National Semiconductor, are utilized in order to get a sharper, more precise filter characteristic than can be obtained with other types of filters. The "tuning" of a switched capacitor filter is dependent upon the frequency of the clock input on conductor 116. For the purposes of the present invention, this is accomplished by causing the frequency of the clock to be $N_A$ times the frequency f, which is the intended center frequency of the filter, and in this case, the frequency of the modulated input signal $V_{107}$ being filtered. $N_A$ should be in the range from roughly 50 to 100. The clock signal on conductor 116 is produced by using count-by-$N_A$ counter 118 to cause the VCO in phase locked loop circuit 115 to produce the frequency NaF to clock switch capacitor filter 111. In many instances, using switch capacitor filter 111 as a notch filter to filter out the frequency f, which is the frequency of the fundamental component of modulated input signal 107, will be advantageous. (Alternately, switch capacitor filter 111 can be a band pass filter with a center frequency of 3f, in which case $N_A$ needs to be 150 to 300.)

In order to obtain the "reference third harmonic" signal on conductor 120, the signal $N_A f$ on conductor 116 must be divided by 3. This is accomplished by count-by-$N_B$ counter 117, where $N_B$ is equal to $N_A/3$. The result is a periodic signal having a frequency of 3f, with no time-varying phase shift between successive cycles.

Switch capacitor filter 111, meanwhile, eliminates the fundamental, producing a third harmonic signal on conductor 112, having a frequency of 3f. However, there will be phase variations in the signal on conductor 12 relative to the phase of the fundamental and also relative to the 3f reference signal on conductor 120, the phase variations representing the midrange voltage levels that represent the modulation input signal that produced the midrange modulated carrier input signal 107. Phase detector 113 detects these phase differences and produces the signal $V_{108}$, corresponding to waveform 108 in FIG. 8, on conductor 114.

We believe that the foregoing third harmonic embodiments of the invention, including third harmonic midlevel modulator circuits and third harmonic decoder circuits such as those in FIGS. 4, 6, 7, and 8 exemplify a new type of modulation, which we refer to as "harmonic" modulation/demodulation, wherein the intelligence or information contained in the carrier is represented by phase differences between the fundamental carrier frequency and certain half-cycles of certain harmonic components of the modulated carrier signal. In accordance with this aspect of the invention, modulated carrier signals can be (but are not necessarily) produced by producing small phase shifts in sinusoidal signals having frequencies that are multiples of a fundamental carrier frequency, and summing the resulting modulated harmonic signals with the fundamental to produce a modulated carrier signal.

Demodulation thereof is achieved by sensing the fundamental frequency, using a suitable circuit to generate a reference signal having the harmonic frequency, with no cycle-to-cycle phase variation, filtering the information-containing harmonic out of the modulated carrier signal, feeding the reference harmonic signal and the filtered information-containing harmonic signal into a phase detector or equivalent circuit, and producing an analog signal, or possibly a chopped analog signal or equivalent representing the original modulating input.

Even if the modulated carrier input is produced by means other than the above third harmonic modulation techniques, the harmonic demodulation technique can be used if the nature of the modulated input signal is such that it contains harmonic signals, cycle-to-cycle phase variations (relative to the fundamental) of which correspond to the modulating input information. For example, we believe that midlevel modulated signals generated by the flipped sine wave technique or the techniques described in the above-referenced parent application Ser. No. 590,281, the midlevel voltages representing the information carried by the modulated carrier signal appears as phase variations in the third harmonic component relative to the fundamental of that signal, and therefore can be recovered by the above-described harmonic demodulation technique. Certainly, if the modulated carrier signal is generated by digital techniques in which the waveform is stored in a read-only memory or the like, the different levels are sequentially output and filtered to produce the midlevel modulated carrier signal, so that it has a third harmonic component with cycle-to-cycle phase variations representing modulation information, the technique of FIG. 9 can be used to recover the modulation information.

Referring next to FIG. 10, a circuit is shown that can be used to generate high frequency midlevel modulated output signals of the type previously described using a 40 megahertz oscillator 151, a decade counter 153, an 8 bit binary counter 155, and a programmable read-only memory (PROM) that stores half-cycles of sinusoidal waveforms, and an 8 bit high speed digital-to-analog converter (DAC) 159. This circuit can produce a 1 megahertz output carrier frequency on conductor 159A, with midrange levels of the resulting modulated output signal determined by three "level select" bits on conductors 162 which are coupled to certain address inputs of the prom 158.

In FIG. 10, oscillator 151 produces a 40 megahertz signal on conductor 152, which is connected to clock inputs of decade counter 153, 8 bit binary counter 155, which divides by 125, and the sample input of DAC 159.

Decade counter 153 divides by 10 to produce four "sample" address outputs 157, which are connected into the least significant address inputs of PROM 158. Decade counter 153 produces an enable signal on conductor 154, which is applied to the clock enable input of 8 bit "divide-by-256" binary counter 155. Modulo 125 is accomplished by making the MSB a "load" command. This preloads the counter to value "3". Thereby, after 31 full carrier cycles there will be a "first falling" (counter state 128) followed by a "second rising" (counter state 3) which makes a BLOCK MARKER of the "fail-to-flip" type.

The LSB output of 8 bit binary counter 155 is connected by conductor 160 to an address input of PROM 158 to distinguish first or second half-cycles stored in PROM 158. The next greater than LSB output of 8 bit binary counter 155 is connected by conductor 161 to another address input of PROM 158 to distinguish rising or falling half-cycle pairs stored in PROM 158. The three level select conductors 162 can be the output of a suitable FIFO digital circuit (such as an MMI 67401) having 3-6 external digital inputs and clocked by the SECOND/FIRST* signal on conductor 160.

Decade counters such as 153 and 8 bit binary counters such as 155 can be easily provide by those skilled in the art. For example, decade counter 153 can be a Texas Instruments 74F162, and 8 bit binary counter 155 can be a pair of 74F163's, also by Texas Instruments. PROM 158 can be a AM27S29 by AMD, and DAC 159 can be a TML1842 by Telmos.

At this point, it should be noted that the midlevel modulated waveforms described above can be stored on magnetic media, such as magnetic tape or the like. Our experiments have resulted in the discovery that an "offset" or "distortion" of the midlevel modulated signal appears to occur as a result of recording the midlevel modulated signals on magnetic media, such as magnetic tape. In accordance with the present invention, we have discovered that most of the energy of midlevel modulated signals is contained in the fundamental and third harmonic, and that the recording of the midlevel modulated signal on magnetic tape results in more delay and attenuation of the third harmonic than of the fundamental. This, of course, intefferes with accurate playback of the tape.

Further in accordance with the present invention, we have discovered that (1) by "pre-compensating" the midlevel modulated signal to be recorded by appropriately producing a compensating phase shift between the fundamental and the third harmonic thereof, and/or providing relative boosting of the third harmonic amplitude, and/or (2) "post-compensating" the signal recovered from the magnetic media by producing relative phase shift between the fundamental component and the third harmonic component of the playback signal, and/or providing a relative boosting of the amplitude of the third harmonic component, precisely the same midlevel information can be recovered from the playback signal as was provided the modulated midlevel modulated signal before it was recorded on the magnetic media.

Perhaps a better understanding of this will be understood by describing our experiments using the circuit in FIG. 15 to generate the waveforms shown in FIGS. 11-14. Rising edge modulations from 85% to 15% are generated by phase shifting the fundamental from a lead of 105° to a lead of 15°. First, in FIG. 11, waveform 301 designates a midlevel modulated signal having its midrange levels halfway between the maximum and minimum signal levels, i.e., with 50% modulation. In the generator circuit in FIG. 15, the fundamental leads the third harmonic by 60°. Signal 301 was fed into an inexpensive Panasonic audio tape cassette recorder, Model RX-F9, with a 4 kilohertz carrier frequency. Boosting of the gain of any of the low range (below 2,000 kilohertz), midrange (2,000 to 6,000 kilohertz) or high range (greater than 6,000 kilohertz) signals could be achieved using its band equalizer controls. The output of the record amplifier appears in waveform 302. The reader can observe that some "unflattening" or distortion of the midrange, information-containing levels occurs in waveform 302. Then, the gain of the amplifier at low frequency was boosted, producing waveform 304. When the midrange frequency gain of the amplifier is boosted, waveform 306 occurs. When the amplifier gain at high frequencies is boosted, waveform 308 appears. Finally, when both midrange and high frequency gain of the amplifier are boosted, waveform 310 is produced by the amplifier. This experiment demonstrates that boosting the gain at midrange and high range frequencies tends to produce more detectable midrange levels from the midlevel modulated input signal 301, because boost and phase advance of the third harmonic relative to the fundamental tends to compensate distortions that are introduced by anmplifier circuitry.

Absence of any selective amplification of the midlevel modulated signal results in "smearing" of the modulation levels. Amplification of low frequency, midfrequency or high frequency components alone tends to distort the modulation levels, producing an "offset" that appears similar to that produced while recording the midlevel modulated input on magnetic tape.

Referring next to FIG. 12, reference numerals 311 represents a midlevel modulated signal with 50% modulation applied to the input of the Panasonic tape recorder. The signal 311 was recorded on the magnetic tape, and during playback in the "monitor mode" of the tape recorder, with no selective amplification of any of the frequencies, playback output waveform 312 was produced. Then, the band equalizer switches of the tape recorder were actuated to provide boosting of midrange and high range frequencies. This resulted in a playback output waveform 314. It was observed that waveform 314 has the appearance of a midlevel modulated signal with a very high level of modulation, i.e., 85% modulation wherein the levels appear to have skewed toward the right.

This led to the experiment resulting in the waveforms of FIG. 13, wherein a 85% modulated or "pre-compensated" midlevel modulated signal 319 with levels deliberately skewed toward the left was fed into the record input of the Panasonic tape recorder. (The audio frequency midlevel modulation circuit of FIG. 15, subsequently described, was utilized to produce the 85% modulated input signal 319, and also the input signals 301 of FIG. 11 and waveform 311 of FIG. 12.) Precompensation skewing was done by advancing the phase of the third harmonic fundamental.

The result was that the playback output waveform 320 was produced, if no selective boosting of any other frequency components of the recorded signal was provided. The midrange levels of the playback signal 320 are barely perceptible. Then, amplitude of midrange and high range frequency components of the "post-compensated" playback signal were increased relative to the fundamental producing the playback output waveform 316, wherein well-defined midrange levels characteristic of a midlevel modulated signal having 50% modulation were obtained.

Incidentally, for a carrier frequency of 4 KHz at a tape speed of one and seven-eighths inches per second, the computed number of bits per inch is approximately 12,800, considerably more than the state-of-the-art, for 8 discrete midrange levels, representing three digital bits per half-cycle of the midlevel modulated carrier.

In FIG. 13, the phase shift difference between the fundamental and the third harmonic component for the input waveform 319 and the playback output waveform 316 is approximately 45 degrees. This difference represents the phase "offset" produced by the specific magnetic media in recording the input signal, with respect to the third harmonic. This is the amount of phase "precompensation" or "post-compensation" that is needed to allow accurate recovery of information contained in midlevel modulated carriers that are recorded on magnetic tape for the above-described Panasonic tape recorder.

In FIG. 13, the third harmonic is advanced 45° so that it lags the fundamental by only 15% to produce the 85° modulated input signal 319.

Referring to FIG. 14, the carrier frequency was increased to 5500 Hz and the phase of the third harmonic was advanced 90° relative to the fundamental, and the third harmonic components of the input signal were boosted by a gain of 4, thereby producing input waveform 325 that was applied to the input of the Panasonic recorder. Waveform 325 can be considered to be a 50% modulated signal with its third harmonic preadvanced by 90° and with the amplitude of its third harmonic "preboosted" by a factor of 4. This signal was recorded on the magnetic tape, producing waveform 326, with no "post boosting" of any of the frequency components. The midrange levels could not be decoded, so then midrange and high range frequency boosting was performed in the playback amplifier. The result was the producing of playback amplifier output signal 328. For the waveforms in FIG. 14, the carrier frequency was 5.5 kilohertz, resulting in a 17.6 kilobit per inch data storage density on tape moving at one and seven-eighths inches per second.

The above experiments indicate that for any particular type of magnetic recording tape, the necessary amount of "precompensation" offset of phase shift between the fundamental and the third harmonic can be determined by record/playback of a 50% midlevel-modulated calibration signal. Precompensation can be adjusted until it produces a 50% modulated midrange level on the playback of the recorded signal. This precompensation offset will be adequate for all modulation levels recorded on this medium at the specified carrier frequency and tape speed. The experiments also indicate that the same 50% calibration signal can help to determine the necessary amount of selective boost of the gain of the third harmonic component to compensate for frequency roll off and to assure accurate recovery of the recorded midlevel information in the playback signal.

Referring next to FIG. 15, an audio frequency midlevel modulation generator circuit 122 used to generate the precompensated midlevel modulated input signals for the above experiments is described. The midlevel modulation encoder 122 includes a 20 megahertz oscillator 123 that produces a clock signal (CLK) on conductor 124, which is connected to inputs of two frequency divider circuits 125 and 125A, a fundamental modulo 256 carrier generator counter 129, a sin(3X) modulo 256 harmonic generator circuit 132, and an 8 bit digital-to-analog converter 140.

The carrier frequency is adjusted by a digital potentiometer 126 which provides two digital signals 127 as inputs to an up/down binary counter-accumulator 154 similar to the 74L5469 by Monolithic Memories. The 12 bit binary value of the number in accumulator 150 directly determines the frequency output of the third harmonic frequency divider 125. The 12 bit number on conductors 150 also becomes one of two inputs to binary multiplier 151 similar to MPY-12IMI by IMI. The other input to the multiplier 151, an 8-bit number on conductors 152 is generated by a "frequency shift factor divided by 3" lookup table in PROM 157 (an AM27S29 by AMD). Inputs to the lookup table are "present data" on conductors 147, "previous data" stored in register 156 and a single "rising/falling" indicator generated by the third harmonic generator circuit 132.

The output of lookup table PROM 157 is a factor that modifies the frequency 143 out of the fundamental frequency divider 128. This factor in conductor 152 is calculated to smoothly shift the phase of the fundamental in order to arrive at a precise phase relation between first and third harmonics at the next third alternate zero crossing of the third harmonic. (See FIG. 18, points 137 and 137A). In contrast to other techniques described herein, the third harmonic is not shifted or modified to create midlevel modulation. It is instead used as a marker to initiate smooth phase transition of the fundamental 142, 142A, 142B between successive midlevel flat points at 137 and 137A. These smooth phase transitions are accomplished by modulating the sample frequency 143 of the fundamental carrier generator 129, so that the fundamental phase can be shifted over a range of 90° in any single half-cycle.

The frequency produced on conductor 130 by frequency divider circuit 125 is adjusted by a digital potentiometer 126. The frequency division can be also adjusted to divide the 20 megahertz signal on conductor 124 from 20 megahertz to 4.88 kilohertz. The enable (ENBL) signal on conductor 130 is provided as an input to generator circuit 132.

A phase difference selection or precompensation circuit 131 containing a three digit octal thumb wheel switch produces a phase advance/retard (PAR) signal on conductor 123, which is connected to a comparator input of the sin(3x) harmonic generator-circuit 132. This modifies the "third alternate zero crossing" phase so that the third harmonic can be advanced for precompensation. Sin(3x) harmonic generator circuit 132 produces a digital sin(3x) signal on conductor 126, which is connected to a digital amplifier circuit (MUX/scaler) 135, which produces an amplification of one or four in response to a select input 138 from panel switch 138A.

See FIG. 18, points 137 and 137A. Sin(3x) harmonic generator circuit 132 also produces two timing control signals. "Rising/falling" indicates the fundamental is rising at 137A and falling at 137. A PHASE SET signal on conductor 134, which is applied as an input to sin(x) fundamental carrier generator 129 and also as an output strobe signal to FIFO (first in, first out) buffer circuit 144 is generated at 137 and at 137A, the "third alternate zero crossing" points that mark the centers of each midlevel flat in the modulated signal 148.

An input strobe signal INSTB on conductor 146 is applied to FIFO buffer 144, a 67401 by MMI. A 3 bit digital data input signal representing one-of-eight the midrange levels of the modulated, precompensated output signal produced at the outputs of differential output amplifier 149 is provided as an input on three conductors 145 to FIFO buffer 144. The 3 bit output of FIFO buffer 144 is produced on three data lines 147, which are coupled to inputs of sin(x) fundamental carrier generator 129, to "frequency shift factors" PROM 157, and to "previous datum" register 156.

The digital sine of the fundamental carrier signal, produced on eight digital conductors 142, is applied to one set of inputs of a digital adder circuit 139. The 8-bit signal representing pre-advanced and pre-boosted sin(3x) appearing on conductors 137 is applied to another set of inputs of digital adder 139, producing an 8 bit digital sum output signal on conductors 141 representing the midlevel modulated carrier signal in digital form. 8-bit digital-to-analog converter 140 produces an analog signal on conductor 148 representing the sum of the sin(x) and sin(3x) (fundamental and third harmonic) signals, with the phase difference between the fundamental and third harmonic components being ±, the amount of phase advance or phase retarding between the fundamental and third harmonic representing the modulation information which varies at each half-cycle plus the "precompensation" phase shift which is constant All of the components utilized in building the audio frequency midlevel modulation circuit of FIG. 15 are standard "off-the-shelf" components. Sin(x) fundamental carrier generator circuit 129 includes a binary counter which generates an address for a PROM (programmable read-only memory) circuit that stores a digital sine function. The sin(x) fundamental carrier generator circuit can be a commercially available part such as a AM29528 and AM29529 from AMD.

The inputs to the counter are a phase advance/retard number represented by the 8-bit output of a "PHASE MOD" PROM in circuit 129 which has inputs from the three data lines 147 containing the desired modulation level. The counter referred to receives the enable signal on conductor 143 from the fundamental frequency divider 128, the clock signal on conductor 124, and the phase shift signal on conductor 134. The counter generates an address that is applied to the inputs of a PROM that stores half-cycles of the fundamental sine wave signal. The counter is set to different starting values by the "PHASE MOD" PROM at the moment of the "PHASE SET" pulse. The transition is "glitch-free" because the counter will already be at or very near that value due to the preceding frequency shift in the circuit elements 157, 151, and 128.

The sin(3x) harmonic generator circuit 132 can be readily implemented by means of a custom programmed PROM, AM27S29 by AMD, or a preprogrammed "off-the-shelf" programmed AM29528 and AM29529 ROM by AMD. It also includes a free running counter that is enabled by the signal "ENBL 3x" on conductor 130. Digital peak detector logic in circuit 132 genrates the "rising/falling" signal 155. A digital comparator generates the "PHASE SET" signal 134 to the fundamental carrier generator 129.

The digital amplifier booster circuit 135 can be an SN74157 digtal multiplexer by Texas Instruments. Digital adder 139 can be an SN74283 integrated circuit by Texas Instruments.

The operation of the above-described circuit is somewhat similar to the one described above with reference to FIG. 7, except that the circuit of FIG. 15 effectively shifts the phase of the fundamental, rather than the third harmonic, to produce the modulated midrange level of the midlevel modulated output signal. Both circuits are "harmonic modulators".

Referring to FIG. 18, waveform 137 designates the boosted sin(3x) signal representd by the 8 bit digital number on conductors 137. Dotted lines 134 and 134A represent the nominal time of the PHASE SET signal on conductor 134 in FIG. 15 when there is no precompensation. Dotted lines 142A and 142B indicate the amount that the fundamental signal sin(x) can be advanced or delayed by the three bit data variations on conductors 147 advancing or delaying the sin(x) fundamental signal relative to the third harmonic sin(3x) signal. Precompensation, set by the digital thumbwheel circuit 131, changes an input parameter to a binary comparator in the 3x harmonic generator 132 so that "phase set" points 134 and 134A are shifted right to advance the third harmonic relative to the fundamental.

Notice that in the nominal phase relation shown in FIG. 18, point 134 marks the center of midrange level in each falling half-cycle, while points 134A marks the center of midrange level in each rising half-cycle.

The three digital octal thumbwheel circuit 131 therefore can be utilized to produce an amount of precompensation as large as necessary that "offsets" the modulation produced by sin(x) fundamental carrier generator circuit 129 in response to the three bit modulation level strobed into it on conductors 147 so that the resulting signal produced at the outputs of differential output amplifier 149 will have its third harmonic component pre-advanced. When recorded on magnetic media, the third harmonic will be retarded relative to the fundamental and the playback signal then can be accurately decoded to reproduce the three bit digital data input 145.

Sin(3x) harmonic generator circuit 132 is normally attenuated in value by a factor of 4. This is accomplished by a simple binary shift of the 8 output bits by two digits toward the least significant bit. The 8 bit sin (3x) signal on conductors 126 thus is a sine wave having a frequency of 3x and an amplitude of only one-fourth of the fundamental having a frequency of x, represented by the 8 bit digital number on conductors 142. The digital amplitude boosting circuit 135 allows the attenuation by a factor of 4 to be selectively avoided, causing third harmonic to have the same amplitude as the fundamental, creating the distortion shown on waveform 325 in FIG. 14 to provide the preboosting described earlier.

The decoder shown in FIG. 9 can be referred to as an inverse Fourier transform type of decoder.

Referring next to FIG. 16, a decoder circuit for both post-compensating and detecting digital information stored on midrange levels of a midlevel modulated input signal applied to conductor 164 is disclosed. The circuit 163 includes a high pass filter 165 for phase correcting and amplitude correcting the input signal in inverse relationship to phase delay and attenuation caused by the transmission medium or recording medium from which the midlevel modulated input signal is received. If it is known how much the phase of the third harmonic has been retarded by the recording media or other transmission media, the post correction filter 165 can effectively advance the third harmonic by that amount relative to the fundamental frequency. If it is known how much the third harmonic component has been attenuated by the recording or transmission media, the post-compensating circuit 165 can amplify the third harmonic by that amount relative to the fundamental. Those skilled in the art of filter design can usually generate analog filter designs to produce a desired transfer function without undue difficulty, as quite a variety of reference texts and software packages for this purpose are readily available. The post compensated midlevel modulated signal produced on conductor 166 is applied to the inputs of a peak buffer circuit 167, which performs the function of unity gain impedance buffering the signal for peak detectors and sample/hold circuits 168 and 169, and to amplifier circuit 174, and to a phase locked loop circuit 175.

The output of the peak buffer 167 is fed into a maximum peak detector and sample/hold circuit 168 and to the input of a minimum peak detector and sample/hold circuit 169. These two circuits are commercically available, and can be implemented by op amps, diodes, and passive components in well-known configurations. The outputs of peak detector and sample/hold circuits 168 and 169 are applied across a ladder network 170 including ten equal resistors. The junction conductors 171-1, . . . 171-9 of the ladder network are connected to the respective negative inputs of nine analog comparators 172, which can be LM319 integrated circuit comparators. The positive input of each of the analog comparators is coupled by conductor 174A to the output of unity gain data amplifier 174. Conductor 174A is connected to a "fail to flip" marker detector circuit that detects the absence of a full transition of the midlevel modulated input circuit, which, as explained in detail in the above-identified parent application, is interpreted as a marker. The fail-to-flip marker circuit is armed by a midlevel transition and disarmed by alternate peaks. If a "same peak" signal comes in after the marker is armed it will go set and declare a "fail-to-flip" block marker.

The outputs of nine comparators are connected to nine output conductors 173, respectively, which are fed into eight input data bits and the enable bit of an encoder/register circuit 179. Peaks are detected either by an "all encoder outputs high" condition or by the presence of a disable level on the ninth bit. Encoder/register circuit 179 performs the function of converting whichever of the eight comparator output levels is high to a 3 bit binary number that represents the midrange level presently being sampled by encoder register circuit 179 in response to the sample clock produced on conductor 178. That is, encoder 179 converts the comparator output to a base N integer with $\log_2^N$ bits representing the modulation level presently being sampled. That sample clock occurs at the middle of the peak-to-peak time period in the FIG. 16 circuit. It occurs without respect to time in the FIG. 17 circuit. A 3 bit binary number representing the digital information stored on the presently sampled midrange level of the midlevel modulated input signal appears on the three conductors 181. The marker signal appears on conductor 180.

The basic operation of the above described portion of the decoder of FIG. 16 is that the maximum positive and negative peaks of a particular transition of the midlevel modulated, post compensated signal are detected and held by peak detector sample/hold circuits 168 and 169, and applied across the ten resistor ladder network 170, causing any common mode voltage to be eliminated, and producing nine midrange levels on conductors 171-1 through 171-9, respectively, representing reference points with which the actual midrange level of the precompensated midlevel modulated input signal on conductor 174A is to be compared. That midrange level will appear at any given moment in only one of eight "windows" defined by the comparators 172 followed by a prior encoder in 179 which can represent three binary bits.

The circuitry yet to be described in FIG. 16 produces the sample clock on conductor 178 with active edges occurring at the midpoints between the times of occurrence of the high and low peaks detected by peak detector and sample/hold circuits 168 and 169. Phase locked loop circuit 175 filters out the third harmonic component of the post compensated signal on conductor 166 in essentially the same manner as the phase locked loop circuit previously described with reference to FIG. 9. One skilled in the art can readily provide such a circuit by means of, for example, any widely known RC low pass filter circuit. A tunable delay circuit 176 adjusts the delay of the clock signal at the output of the voltage controlled oscillator of circuit 175, which is doubled in frequency but synchronous with the basic carrier frequency of the midlevel modulated input on conductor 164, and feeds the delayed signal through clock buffer circuit 177 so that the active edges of the sample clock signal 178 occur precisely in the center of each peak-to-peak period which is near to in the centers of the midrange levels produced on conductors 171-1 through 171-9.

A possible limitation of the technique described in FIG. 16 is that the "harmonic modulation" technique involving small phase shifts of the third harmonic component of the midlevel modulated signal relative to its fundamental may result in slight phase shifts of the peaks depending upon whether the midrange level is a high, intermediate, or low level. Such phase shifts may decrease the accuracy of sampling of the analog comparator outputs by the encoder/register 179.

Figure 17:
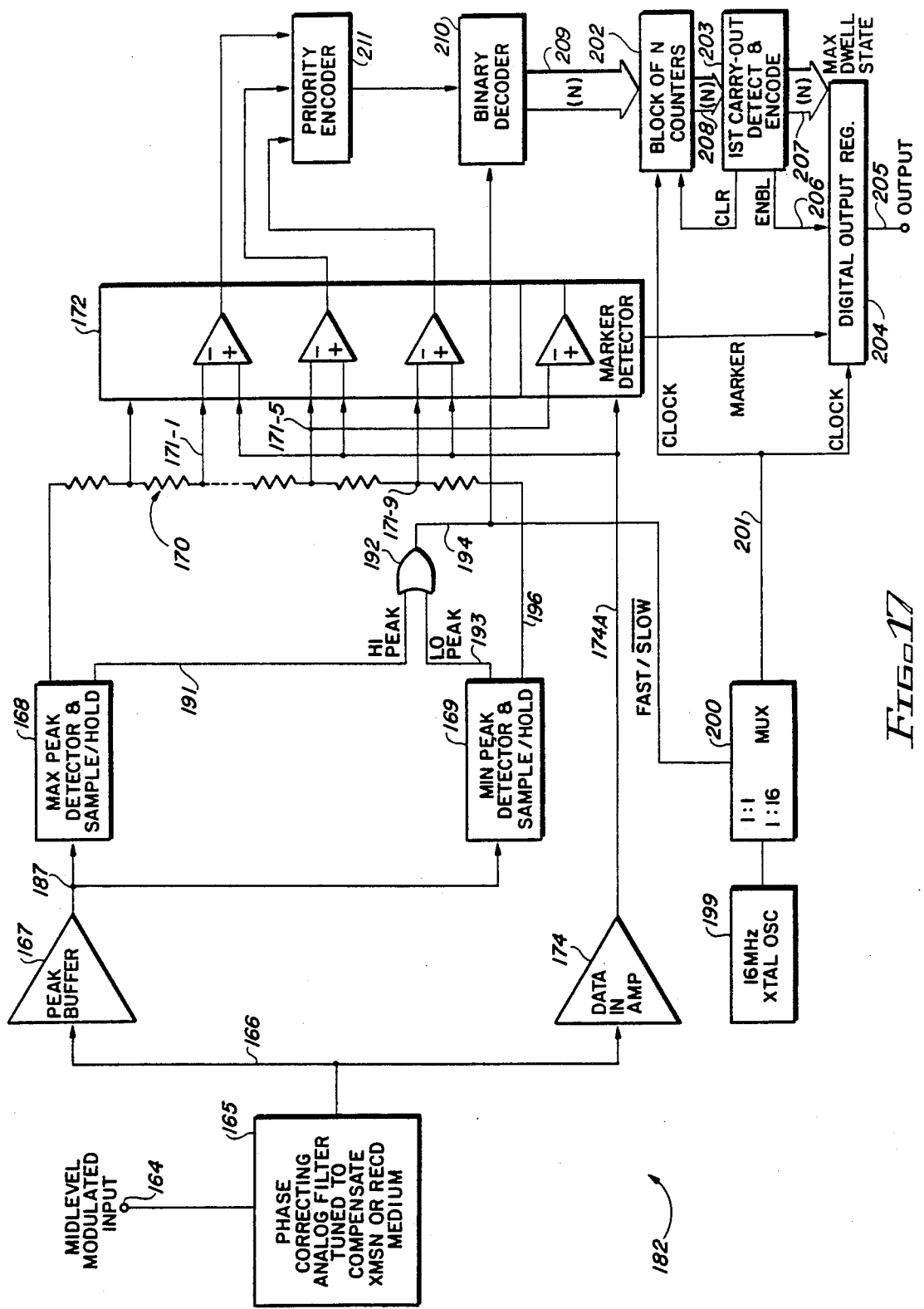
FIG. 17 is a block diagram of another circuit for post-compensating and decoding midlevel modulation signals.

Referring next to FIG. 17, another technique is described for sampling the outputs of the nine comparators. In FIG. 17, the postcompensation circuit 165, buffer 167, data amplifier 174, peak detector sample/hold 168 and 169, the resistor ladder network 170, and the comparators 172 and the marker detector circuit are the same as in FIG. 16. However, the comparator output levels are not used in the same manner, and the clock signal on conductor 201 is not synchronized to the fundamental frequency of the midlevel modulated input signal on conductor 164. Instead, a free running oscillator 199 produces an output that is fed into a multiplexer circuit 200 that can be controlled by a fast/slow input on conductor 194 to pass through the 16 megahertz oscillator frequency or a slower clock signal that is divided by a factor of 16 in response to the output of an OR gate 192 which is active during peak periods. OR gate 192 has its two inputs connected by conductors 191 to maximum peak detector and sample/hold circuit 168 ANDs to an output of minimum peak detector and sample/hold circuit 169 on conductor 193.

The nine comparator outputs collectively designated by reference numeral 212 are fed into a priority decoder circuit 211, which can be a 74L5148 by Texas Instruments. The 3-bit output is are connected to the inputs of a binary encoder 210, which is implemented by means of a programmed array logic integrated circuit (PAL) like PAL16L8 by MMI that performs the functions of setting one-of-eight counter enable lines active during midlevel intervals and setting all eight enable lines active during peak intervals. The enable input of binary encoder 210 is connected to conductor 194, indicating when the clock signal on conductor 201 has a 16 megahertz frequency during peak intervals, rather than a 1 megahertz frequency during all midlevel intervals. The 8 outputs of binary encoder 210 are applied to the enable inputs of eight identical counters contained in block 202. Each of the eight counters is clocked by the signal on clock line 201, which may be at 1 megahertz or 16 megahertz. The eight counter carry outputs are fed into inputs of a circuit 203 which detects which of the eight counters 202 requires the longest amount of time to "time out", or generate a carry signal.

The eight output conductors 207 from circuit 203 are encoded to produce a three-bit binary number that represents the counter the carry output of which was generated first when the eight counters are "dumped" by counting at a high clock rate on conductor 201 during the peak interval after the present transition of the midlevel modulated signal is complete. That first counter carry out signal thereby represents the comparator window in which the present midrange level of the midlevel modulated input on conductor 164 "dwelled" for the longest period of time, and hence also corresponds to the digital three bit data represented by that midrange level of the present half-cycle transition of the midlevel modulated input signal.

The first carry out detect and encode circuit 203 can be implemented by means of a priority encoder such as a 74LS148 by Texas Instruments. The eight counters in block 202 each are 8-bit counters, which can be implemented by means of a 74F779 by Texas Instruments. The clear (CLR) output signal generated by circuit 203 resets the eight counters in block 202 when the current peak interval ends.

The occurrence of either a high or low peak detected by circuits 168 or 169 causes OR gate 192 to produce a positive signal on conductor 194, which causes binary encoder to perform the function of readout by enabling all eight counters simultaneously, and also causes multiplexer circuit 200 to switch to the fast clock rate to thereby "dump" the eight counters in block 203 at a very high speed during the peak time, since while the modulated input is at its peak levels there is nothing meaningful to count or measure. The first of the counters to reach its maximum value and generate the above-mentioned carry signal is detected by the circuit 203.

The foregoing described techniques force modulation upon a fixed frequency, fixed amplitude carrier modulation in the form of an N-level flat zone or midrange level at various levels between the carrier peaks. Signal information is carried in the ratio of the peak-to-peak amplitude and the peak-to-flat zone amplitude. The amount of information contained in each ratio is given by a base N digit wherein the value of N is equal to the number of distinguishable ratio values that can be encoded by the modulator. For example, where a modulator is designed to encode eight different flat levels, each half-cycle of its modulated carrier conveys a base 8 digit, which corresponds to three binary bits of information.

Two basic types of midlevel modulation encoding, referred to as "third harmonic encoding" and "flip sine wave encoding" have been described. In third harmonic encoding, a phase modulated carrier is summed with an attenuated and phase shifted third harmonic thereof. Precompensation is easily accomplished by an adjustable constant value phase shift of the third harmonic. The level of the flat zone in each half-cycle of the carrier is controlled by modulating the phase difference relationship between the first and third harmonics. The phase relationship is switched over a range of 0° to 90° at every third alternate zero crossing of the free running third harmonic. Rising half-cycles of the carrier are summed with falling zero crossing of the third harmonic. The information contained in the peak-to-flat ratios is the manifestation of a more fundamental phase difference modulation between the first and third harmonics of the carrier.

In the flipped sine wave encoding technique, a carrier frequency f is generated by combining pairs of complementary half-cycles of frequency 2f. The modulator selects one-of-N pairs of the second harmonic half-cycles at the start of each half-cycle of the carrier. The 2f half-cycles are complementary because the sum of the amplitudes of any of these pairs is exactly equal to the peak-to-peak amplitude of the carrier. Each second harmonic pair is joined by a 180 degree phase flip at zero slope which marks the flat point. For example, where the falling edge pair, the first half-cycle is a sine wave extending from 90 degrees at the top peak of the carrier to 270 degrees at the flat point. The second half-cycle is made tangent at the flat point but is flipped 180 degrees so that it extends from 90 degrees at the flat point to 270 degrees at the bottom peak of the carrier. Precompensation of flipped sine wave signals is more difficult than precompensation of third harmonic encoded signals.

A spectrum analysis indicates that the bulk of the signal energy in the frequency domain for a midlevel modulated signal is concentrated in two narrow bands, one-fourth of an octive wide, centered at the first and third harmonics. This discovery has made signal correcting compensation for phase delay and attenuation caused by signal recording media or signal transmission media relatively simple. Precompensation is achieved at the input of the transmission or recording medium to add a fixed phase advance to the free running third harmonic (which is summed with the phase modulated fundamental to provide midlevel modulation) and applies an adjustable gain to that third harmonic in amounts necessary to produce an amount of phase advance and gain to exactly compensate the relative delay and attenuation caused by the recording medium or signal transmission medium. Post-compensation at the playback output of a recorder or at the output end of a transmission medium can be achieved by dual pass band circuit that performs the function of enhancing the fundamental and third harmonic relative to other signal components and by enhancing the third harmonic relative to the fundamental. However, while the passband for the free running third harmonic can be only a quarter-octave wide, the pass band for the fundamental must be a full octave wide above and below the nominal frequency in order to accommodate the 0°–90° phase modulation that is switched at each half-cycle. Signals generated by third harmonic encoding can be readily compensated because the fundamental and third harmonic are separately available in the encoding schemes. Signals generated by flipped sine wave encoding have no discontinuities or phase modulated components but then are more difficult to precompensate because the phase and amplitude of the third harmonic must first be derived before it can be subtracted from the signal, phase shifted by an adjustable constant, amplified, and summed back into the signal. Alternately, the flipped sine wave encoded signal can be digitally precompensated based on a listed set of precalculated third harmonic phase advances matched with N possible complementary half-cycle pairs.

Circuitry has been described for digital decoding of midlevel modulated analog signals and post-compensating the signal to minimize distortions imposed by recording media or signal transmission media. The presence of calibration cycles enables automatic adjustment of post-compensation parameters. The decoders eliminate common mode distortions of the amplitude and frequency, thereby erasing all AM and FM modulation, and normalizing the current peak values so that an N+2 window amplitude detector or "template" can be normalized. The decoders then detect the ratio of the current peak-to-peak amplitude to the amplitude of the current half-cycle flat zone of the modulated signal. Detection of a correct sample point for the flat zone and assignment of a correct one-of-N window value to the present half-cycle are achieved in various ways, including the following. In one method, the peak points within a phase locked loop circuit are detected and a phase delayed "midpoint sample clock" signal is generated thereby. In another technique, the minimum slope point between the peaks is detected either by analog or digital techniques, with a first-and-second-difference digital sampling arithemetic unit In a third technique, the dwell time of the modulated signal within each of the N amplitude windows, normalized by current peak-to-peak values, during each half-cycle of the modulated carrier is measured. The amplitude zone with the maximum dwell time is presumed to be the window that contains the flat zone.

The above-described techniques make practical the storage of information on magnetic media such as tape or disks at densities three to ten times greater than is presently possible with such media and conventional record/playback technology. Digital data transmission using the described techniques require only one-third as many signal conductors, if eight-level modulation is utilized. Transmission data bit rates can be increased from three to 20 times through typical transmission media such as telephone, telex, radio, or television. The midlevel modulation technique can be transmitted and detected as a separate channel within any given AM or FM band. The modulation is self-calibrating and self-clocking, and can be precompensated to match ordinary non-random distortions imposed by any recording or transmission medium so that the modulated signal emerges in perfect condition on playback. It is envisioned that the encoding and decoding technique described can be utilized to reduce the I/0 pin count and enhance the I/0 bandwidth of certain VLSI (very large scale integrated) circuits.

While the invention has been described with respect to a number of embodiments, those skilled in the art will be able to make various modifications to the described embodiment without departing from the true spirit and scope of the invention It is intended that all techniques which are equivalent to those described herein in that they perform substantially the same function in substantially the same way to achieve the same result are within the scope of the invention.

We claim:
1. A circuit for producing a midlevel modulated carrier signal, the circuit comprising in combination:
  (a) an operational amplifier having first and second inputs and an output;
  (b) feedback means for coupling the output of the operational amplifier to the first input thereof;
  (c) first resistive means for coupling a carrier signal having a first frequency to the second input of the operational amplifier;
  (d) modulating means responsive to a modulation input signal for coupling a portion of the carrier signal determined by the modulation signal to the first input of the operational amplifier; and
  (e) switching means coupled to the second input of the operational amplifier for switching the signal at the second input thereof to levels that cause switching of the operational amplifier between inverting and noninverting modes at a frequency equal to the first frequency, whereby the output of the operational amplifier produces the midlevel modulated carrier signal with midrange levels representative of the values of the modulation signal during rising and falling half-cycles of the modulated carrier signal.

2. The circuit of claim 1 wherein the modulating means includes a voltage variable resistance that varies in accordance with the level of the modulation signal.

3. The circuit of claim 1 wherein the switching means includes a field effect transistor having a drain electrode coupled to the second input of the operational amplifier, a gate electrode coupled to a switching signal that is periodic at a frequency equal to one-half of the first frequency, and a resistive bias circuit including a first resistor coupled between the gate and source electrodes of the field effect transistor and a second resistor coupled between the source electrode of the field effect transistor and a reference conductor.

4. A method of providing a midlevel modulated carrier signal having a plurality of midrange levels in a plurality of respective rising and falling transitions thereof, the method comprising the steps of:
  (a) providing a first signal having a first frequency and a second signal which has a fixed phase relationship to the first signal and has a second frequency that is an integral multiple of the first frequency;
  (b) producing a relative shift between the phases of the first and second signals in accordance with a plurality of levels of an analog modulation signal; and
  (c) summing the first and second signals to produce the midlevel modulated carrier signal with respective midrange levels in each rising transition and each falling transition of the modulated carrier signal, each midrange level representing a corresponding level of the analog modulation signal.

5. The method of claim 4 wherein the second signal is a third harmonic of the first signal.

6. The method of claim 5 wherein step (a) includes producing the second signal by means of a phase locked loop circuit including a voltage controlled oscillator producing the second signal on an output thereof, a divide-by-three counter coupled between the output of the voltage controlled oscillator and an input of a phase detector circuit having another input receiving the first signal and an output coupled to a voltage control input of the voltage controlled oscillator, and summing the analog modulation signal with an error signal produced on the output of the phase detector to vary the relative shift between the phases of the first and second signals.

7. The method of claim 6 including filtering the first and second signals before summing them to produce the midlevel modulated carrier signal.

8. The method of claim 5 including precompensating the midlevel modulated carrier signal before conducting it through or into a medium that distorts the phase and/or amplitude of the third harmonic component thereof relative to the fundamental component of the midlevel modulated carrier signal by producing a relative phase shift between the first signal and the second signal in inverse relationship to the relative phase shift produced by the transmission medium and/or producing a relative change in the amplitudes of the first and second signals in inverse relationship to the relative attenuation of the third harmonic component by the transmission medium before transmitting the midlevel modulated carrier signal into the transmission medium.

9. The method of claim 8 wherein the medium includes a transmission medium for communicating the midlevel modulated carrier signal from one location to another.

10. The method of claim 9 wherein the medium includes a storage medium for storing a midlevel modulated carrier signal.

11. A method of demodulating a midlevel modulated carrier signal having midrange levels representing analog modulation information in each of its rising transitions and falling transitions, respectively, the method comprising the steps of:
(a) filtering a third harmonic component of the midlevel modulated carrier signal out of the midlevel modulated carrier signal;
(b) generating a reference signal that has a fixed phase relationship to a fundamental component of the midlevel modulated carrier signal and also has a frequency three times the frequency of the fundamental component; and
(c) detecting the phase differences between the third harmonic and the reference signal or each rising transition and falling transition, respectively, and using the phase differences to produce a demodulated signal that represents the analog modulation information.

12. The method of claim 11 including utilizing a phase locked loop circuit including a count-by-three circuit to generate the reference signal to divide the output of a voltage controlled oscillator by three before comparing the phase of the midlevel modulated carrier signal to the phase of the divided output signal.

13. The method of claim 11 wherein the midlevel modulated carrier signal is received from a medium that distorts the phase and/or the amplitude of the third harmonic component, relative to the fundamental component, the method including post-compensating the midlevel modulated carrier signal by producing a relative phase shift and/or amplitude change between the third harmonic component in the midlevel modulated carrier signal and the fundamental component in the midlevel modulated carrier in inverse relationship to the distortion produced by the medium.

14. The method of claim 13 wherein the medium is a signal transmission medium.

15. The method of claim 13 wherein the medium is a storage medium for storing the midlevel modulated carrier signal.

16. A method of demodulating a midlevel modulated carrier having N permissible midrange levels in each of a plurality of respective rising transitions and falling transitions thereof, N being an integer, the method comprising the steps of:
(a) detecting and holding a maximum voltage of a high peak of the midlevel modulated carrier signal, and detecting and holding a minimum voltage of a low peak of the midlevel modulated carrier signal;
(b) applying the maximum voltage and minimum voltage across a network that produces N separate reference voltages respectively representing the N different permissible midrange levels of each of the transitions of the midlevel modulated carrier signal; and
(c) comparing by means of N comparators the midlevel modulated carrier signal to the N reference voltages to determine the one of the N reference voltages to which the midrange level of the present transition is most nearly equal.

17. The method of claim 16 including encoding outputs of the comparators to produce a binary number equivalent to a base N integer and having $\log_2^N$ bits representative of modulation information contained in the midrange level of the present transition.

18. The method of claim 16 including gating the outputs of the comparators into an encoder at times midway between the time of the high peak of the present transition of the midlevel modulated signal and the time of the low peak of the present transition of the midlevel modulated signal.

19. The method of claim 18 wherein the gating is performed by means of a signal generated by a phase locked loop circuit receiving the midlevel modulated carrier signal as an input and producing an adjustably delayable clock signal having a frequency that is twice the repetition rate of the midlevel modulated carrier signal.

20. The method of claim 16 including determining the one of the N reference voltages to which the midrange level of a present transition of the midlevel modulated carrier signal is closest for the longest time, and encoding a signal representative of that one of the N reference voltages to produce a base N integer or $\log_2 N$ binary number representative of modulation information contained in the midrange level of the present transition of the midlevel modulated carrier signal.

21. The method of claim 20 including utilizing N counters to count the durations of the dwells of the midrange level of the present transition of the midlevel modulated carrier signal during which it is close to each of the N reference voltages, and then simultaneously clocking each of the N counters at an increased frequency to time them out, and encoding carry out signals of the counters to determine the binary number.

22. A circuit for providing a midlevel modulated carrier signal having a plurality of midrange levels in a plurality of respective rising and falling transitions thereof, the circuit comprising:
(a) means for providing a first signal having a first frequency and means for providing a second signal which has a fixed phase relationship to the first signal and has a second frequency that is an integral multiple of the first frequency;

(b) means for producing a relative shift between the phases of the first and second signals in accordance with the levels of an analog modulation signal; and (c) summing means for summing the first and second signals to produce the midlevel modulated carrier signal with respective midrange levels in each rising transition and falling transition of the modulated carrier signal, each midrange level representing a corresponding valve of the analog modulation signal.

23. The circuit of claim 22 wherein the second signal is a third harmonic of the first signal.

24. The circuit of claim 23 wherein the second signal producing means includes a phase locked loop circuit including a voltage controlled oscillator producing the second signal on an output thereof, a divide-by-three counter coupled between the output of the voltage controlled oscillator and an input of a phase detector circuit having another input receiving the first signal and an output coupled to a voltage control input of the voltage controlled oscillator, and wherein the summing means includes means for summing the modulation signal with an error signal produced on the output of the phase detector to vary the relative shift between the phases of the first and second signals.

25. The circuit of claim 24 including means for filtering the first and second signals before summing them to produce the midlevel modulated carrier signal.

26. The circuit of claim 23 including means for precompensating the midlevel modulated carrier signal before conducting it through or into a medium that distorts the phase and/or amplitude of the third harmonic component thereof relative to the fundamental component of the midlevel modulated carrier signal.

27. The circuit of claim 26 wherein the precompensating means includes means for producing a relative phase shift between the first signal and the second signal in inverse relationship to the relative phase shift produced by the transmission medium.

28. The circuit of claim 26 wherein the precompensating means includes means for producing a relative change in the amplitudes of the first and second signals in inverse relationship to the relative attenuation of the third harmonic component by the transmission medium.

29. The circuit of claim 26 wherein the medium includes a transmission medium for communicating the midlevel modulated carrier signal from one location to another.

30. The circuit of claim 27 wherein the medium includes a storage medium for storing a midlevel modulated carrier signal.

31. A circuit for modulating a midlevel modulated carrier signal having a midrange level representing analog modulation information in each of its rising transitions and falling transitions, respectively, the circuit comprising:

(a) means for filtering a third harmonic component of the midlevel modulated carrier signal out of the midlevel modulated carrier signal;

(b) means for generating a reference signal that has a fixed phase relationship to a fundamental component of the midlevel modulated carrier signal and also has a frequency three times the frequency of the fundamental component;

(c) means for detecting the phase differences between the third harmonic and the reference signal of each rising transition and falling transition, respectively, and using the phase differences to produce a demodulated signal that represents the analog modulation information.

32. The circuit of claim 31 including utilizing a phase locked loop circuit including a count-by-three circuit to generate the reference signal to divide the output of a voltage controlled oscillator by three before comparing the phase of the midlevel modulated carrier signal to the phase of the divided output signal.

33. The circuit of claim 31 wherein the midlevel modulated carrier signal is received from a medium that distorts the phase and/or the amplitude of the third harmonic component, relative to the fundamental component, the circuit including means for post-compensating the midlevel modulated carrier signal by producing a relative phase shift and/or amplitude change between the third harmonic component in the midlevel modulated carrier signal and the fundamental component in the midlevel modulated carrier in inverse relationship to the distortion produced by the medium.

34. The circuit of claim 33 wherein the medium is a signal transmission medium.

35. The circuit of claim 33 wherein the medium is a storage medium for storing the midlevel modulated carrier signal.

36. A circuit for demodulating a midlevel modulated carrier signal having N permissible midrange levels in each of a plurality of rising transitions and falling transitions thereof, respectively, N being an integer, the circuit comprising:

(a) means for detecting and holding a maximum voltage of a high peak of the midlevel modulated carrier signal, and means for detecting and holding a minimum voltage of a low peak of the midlevel modulated carrier signal;

(b) a network that produces N separate reference voltages respectively representing the N different permissible midrange levels of each of the rising and falling transitions of the midlevel modulated carrier signal in response to a voltage equal to the difference between the maximum voltage and the (c) means for applying the maximum voltage and minimum voltage across the network; and (d) means for comparing the midlevel modulated carrier signal through the N reference voltages to determine the one of the N reference voltages to which the midrange level of the present transition is most nearly equal, the comparing means including N comparators.

37. The circuit of claim 36 including means for encoding outputs of the comparators to produce a binary number equivalent to a base N integer and having $\log_2^N$ bits representative of modulation information contained in the midrange level of the present invention.

38. The circuit of claim 36 including means for gating the outputs of the comparators into the encoding means at times midway between the time of the high peak of the present transition of the midlevel modulated signal and the time of the low peak of the present transition of the midlevel modulated signal.

39. The circuit of claim 38 wherein the gating means includes a phase locked loop circuit receiving the midlevel modulated carrier signal as an input and producing a clock signal having a frequency that is twice the repetition rate of the midlevel modulated carrier signal and means for adjustably delaying the clock signal so that its active edges occur midway between the two of the maximum voltages and the two of the minimum voltages of the present transition of the midlevel modulated carrier signal.

40. The circuit of claim 36 including means for determining the one of the N reference voltages to which the midrange level of a present transition of the midlevel modulated carrier signal is closest for the longest time, and means for encoding a signal representative of that one of the N reference voltages to produce a base N integer or a $\log_2 N$ binary number representative of modulation information contained in the midrange level of the present transition of the midlevel modulated carrier signal.

41. The circuit of claim 40 including N counters counting the durations of the dwells of the midrange level of the present transition of the midlevel modulated carrier signal during which it is close to each of the N reference voltages, and means for simultaneously clocking each of the N counters at an increased frequency to time them out, the encoding means including means for encoding carry out signals of the counters to determine the binary number.

* * * * *